(12) United States Patent
Jang et al.

(10) Patent No.: US 11,569,157 B2
(45) Date of Patent: Jan. 31, 2023

(54) SEMICONDUCTOR PACKAGE AND METHOD OF MANUFACTURING THE SAME

(71) Applicant: Samsung Electronics Co., Ltd., Suwon-si (KR)

(72) Inventors: Yeonho Jang, Goyang-si (KR); Jongyoun Kim, Seoul (KR); Jungho Park, Cheonan-si (KR); Jaegwon Jang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 31 days.

(21) Appl. No.: 16/946,209

(22) Filed: Jun. 10, 2020

(65) Prior Publication Data

US 2021/0125908 A1 Apr. 29, 2021

(30) Foreign Application Priority Data

Oct. 29, 2019 (KR) .................. 10-2019-0135586

(51) Int. Cl.
*H01L 23/498* (2006.01)
*H01L 21/48* (2006.01)
*H01L 23/00* (2006.01)

(52) U.S. Cl.
CPC .... *H01L 23/49816* (2013.01); *H01L 21/4853* (2013.01); *H01L 21/4857* (2013.01);
(Continued)

(58) Field of Classification Search
CPC ....... H01L 2224/023–024; H01L 2224/00–98; H01L 2224/08151–08268; H01L 2224/03–03921; H01L 2224/09505; H01L 2224/085–08506; H01L 2224/0812–8123; H01L 2224/05655; H01L 2224/05155; H01L 2224/05647; H01L 2224/05147; H01L 2224/05075–05084; H01L 2224/05575–05584; H01L 2224/05541–05548; H01L 2224/05005–05009;
(Continued)

(56) References Cited

U.S. PATENT DOCUMENTS 6,424,036 B1 * 7/2002 Okada ............... H01L 21/76841
257/734
6,458,683 B1 * 10/2002 Lee .......................... H01L 24/11
257/E21.171

(Continued)

FOREIGN PATENT DOCUMENTS

JP 6155571 7/2017

*Primary Examiner* — Monica D Harrison
*Assistant Examiner* — Lawrence C Tynes, Jr.
(74) *Attorney, Agent, or Firm* — Myers Bigel, P.A.

(57) ABSTRACT

A semiconductor package includes a semiconductor chip; a redistribution insulating layer including a first opening; an external connection bump including a first part in the first opening; a lower bump pad including a first surface in physical contact with the first part of the external connection bump and a second surface opposite to the first surface, wherein the first surface and the redistribution insulating layer partially overlap; and a redistribution pattern that electrically connects the lower bump pad to the semiconductor chip.

18 Claims, 27 Drawing Sheets

(52) U.S. Cl.
CPC .. *H01L 23/49822* (2013.01); *H01L 23/49838* (2013.01); *H01L 23/49866* (2013.01); *H01L 24/16* (2013.01); *H01L 2224/16227* (2013.01)

(58) Field of Classification Search
CPC .................. H01L 2224/8085–8089; H01L 2224/8185–8189; H01L 2224/16155–16168; H01L 2224/16225–1624; H01L 2224/24155; H01L 2224/24225–24227; H01L 2224/32155–32168; H01L 2224/32225–3224; H01L 2224/40155–40165; H01L 2224/40225–4024; H01L 24/00–98; H01L 24/03; H01L 23/49822; H01L 23/5383; H01L 23/49833; H01L 23/5385; H01L 23/49827; H01L 23/5384
See application file for complete search history.

(56) References Cited

U.S. PATENT DOCUMENTS

| | | |
|---|---|---|
| 8,575,493 B1 | 11/2013 | Xu et al. |
| 9,257,402 B2 | 2/2016 | Yoshida et al. |
| 2009/0057893 A1 | 3/2009 | Iwaki |
| 2011/0210443 A1 | 9/2011 | Hart et al. |
| 2012/0083114 A1* | 4/2012 | Perfecto ............... H01L 24/05 438/614 |
| 2012/0126397 A1 | 5/2012 | Chien et al. |
| 2013/0299961 A1* | 11/2013 | Chen ................... H01L 24/13 257/706 |
| 2013/0341785 A1 | 12/2013 | Fu et al. |
| 2014/0021600 A1* | 1/2014 | Daubenspeck ....... H01L 23/562 257/737 |
| 2017/0365564 A1* | 12/2017 | Yu ........................ H01L 24/02 |
| 2018/0151546 A1 | 5/2018 | Lin et al. |
| 2018/0294255 A1 | 10/2018 | Liu |
| 2019/0348352 A1* | 11/2019 | Huang .................. H01L 24/03 |

* cited by examiner

SEMICONDUCTOR PACKAGE AND METHOD OF MANUFACTURING THE SAME

CROSS-REFERENCE TO RELATED APPLICATION

This application claims priority to Korean Patent Application No. 10-2019-0135586, filed on Oct. 29, 2019, in the Korean Intellectual Property Office, the disclosure of which is incorporated herein in its entirety by reference.

BACKGROUND

Some embodiments of the inventive concept relate to semiconductor packages and methods of manufacturing the same.

To accommodate the trend of miniaturization and weight lightening of electronic components, semiconductor packages with reduced volume and high capacity data processing performance may be used. Such semiconductor packages may have an increased number of input/output (I/O) terminals, and, thus, a distance between connection pads of a semiconductor package may be reduced. In addition, the size of connection terminals attached to the connection pads may also be reduced. With the miniaturization of a connection structure of the semiconductor package, damage to the connection pad and the connection terminal due to external stress may occur.

SUMMARY

Embodiments of the inventive concept may provide a semiconductor package with an improved reliability and a method of manufacturing the same.

According to some embodiments of the inventive concept, there is provided a semiconductor package including a semiconductor chip; a redistribution insulating layer including a first opening; an external connection bump including a first part in the first opening; a lower bump pad including a first surface in physical contact with the first part of the external connection bump and a second surface opposite to the first surface, wherein the first surface and the redistribution insulating layer partially overlap; and a redistribution pattern that electrically connects the lower bump pad to the semiconductor chip.

According to some embodiments of the inventive concept, there is provided a semiconductor package including a semiconductor chip; a redistribution insulating layer including an opening; an external connection bump including a first part in the opening; a lower bump pad including a first surface in physical contact with the first part of the external connection bump and a second surface opposite to the first surface; a lower seed layer on the first surface of the lower bump pad and in physical contact with a sidewall of the external connection bump; and a redistribution pattern that electrically connects the lower bump pad to the semiconductor chip, wherein a surface of the lower seed layer in physical contact with the first surface of the lower bump pad is coplanar with a surface of the external connection bump in physical contact with the first surface of the lower bump pad.

According to some embodiments of the inventive concept, there is provided a semiconductor package including a semiconductor chip; a redistribution insulating layer including an opening; an external connection bump including a first part in the opening; a lower bump pad including a first conductive layer in physical contact with the first part of the external connection bump, a conductive barrier layer on the first conductive layer, and a second conductive layer spaced apart from the first conductive layer with the conductive barrier layer interposed therebetween; and a redistribution pattern that electrically connects the lower bump pad and the semiconductor chip.

According to another aspect of the inventive concept, there is provided a method of manufacturing a semiconductor package, the method including forming a first insulating layer on a carrier substrate; forming a lower seed layer on the first insulating layer; forming a lower bump pad on the lower seed layer, the lower bump pad having a flat first surface in physical contact with the lower seed layer; forming at least one insulating layer on the first insulating layer and at least one redistribution pattern electrically connected to the lower bump pad; placing a semiconductor chip on the at least one redistribution pattern; removing the carrier substrate; forming an opening that exposes a part of the lower seed layer by removing a part of the first insulating layer; exposing a part of the first surface of the lower bump pad by removing the part of the lower seed layer exposed through the opening of the first insulating layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
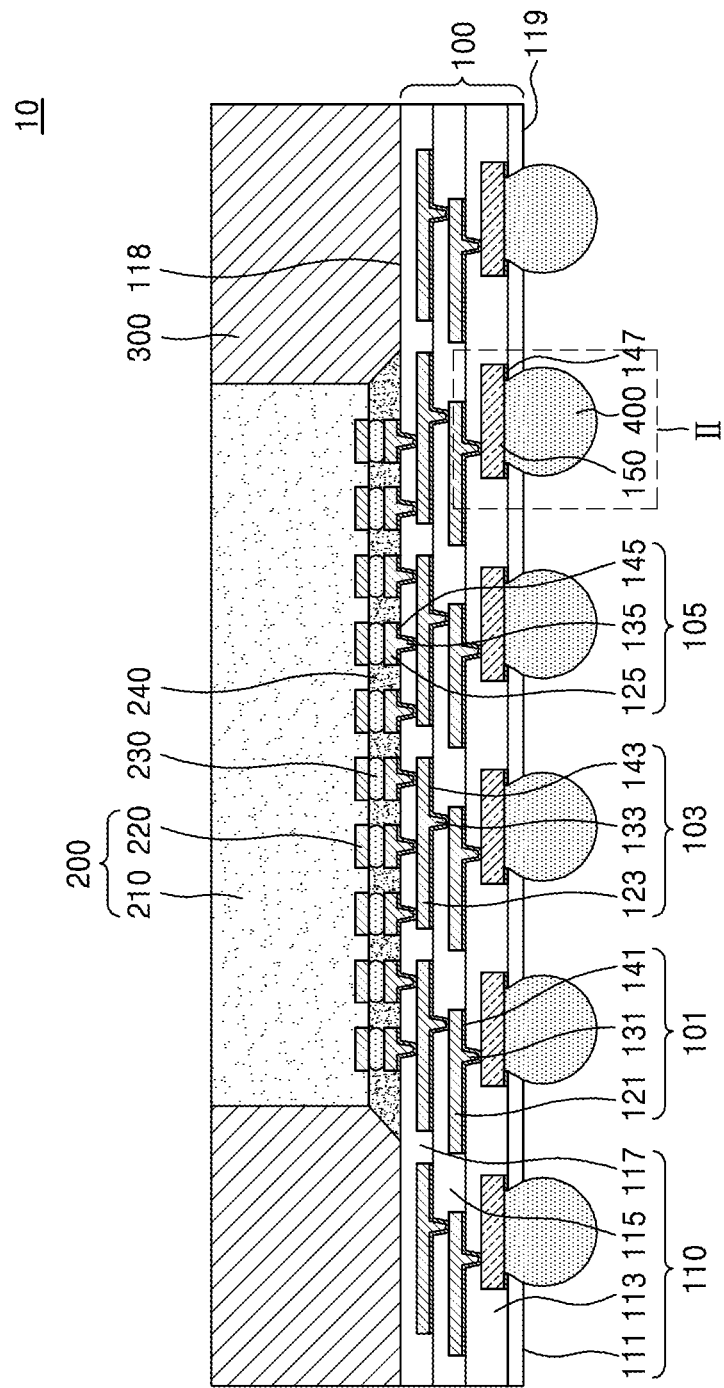
FIG. 1 is a cross-sectional view illustrating a semiconductor package according to some embodiments of the inventive concept.

Hereinafter, embodiments of the inventive concepts will be described in detail with reference to the accompanying drawings. The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Figure 2:
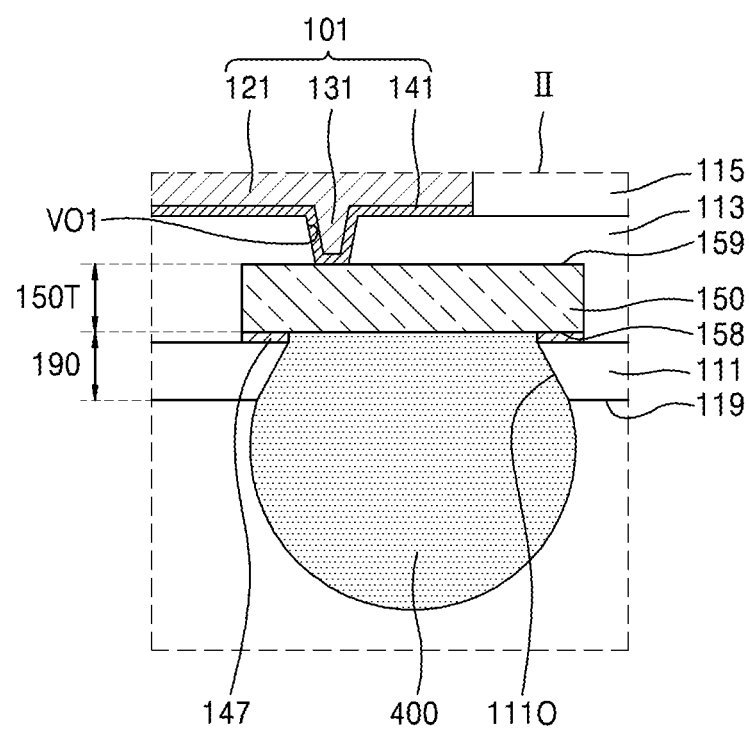
FIG. 2 is an enlarged cross-sectional view illustrating an enlarged region "II" of FIG. 1.
Figure 3:
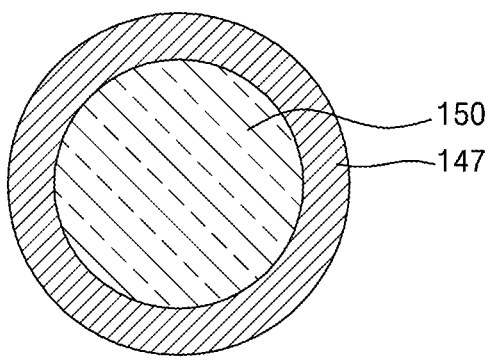
FIG. 3 is a plan view illustrating a lower bump pad and a lower seed layer according to some embodiments of the inventive concept.

FIG. 1 is a cross-sectional view illustrating a semiconductor package 10 according to some embodiments of the inventive concept. FIG. 2 is an enlarged cross-sectional view illustrating an enlarged region labeled "II" of FIG. 1. FIG. 3 is a plan view illustrating a lower bump pad 150 and a lower seed layer 147 of FIG. 1.

Referring to FIGS. 1 to 3, the semiconductor package 10 may include a redistribution structure 100, a semiconductor chip 200, a molding layer 300, and an external connection bump 400.

The redistribution structure 100 may include a redistribution insulating layer 110, first to third redistribution patterns 101, 103, and 105, and the lower bump pad 150.

The redistribution insulating layer 110 may include a plurality of insulating layers, for example, first to fourth insulating layers 111, 113, 115, and 117. Each of the insulating layers may be formed, for example, from a material layer including an organic compound. In some embodiments, each of the insulating layers may be formed from the material layer including an organic polymer material. In some embodiments, each of the insulating layers may include an insulating material comprising a Photo Imagable Dielectric (PID) material capable of photolithography processing. For example, each of the insulating layers may be formed of photosensitive polyimide (PSPI). Alternatively, in other embodiments, each of the insulating layers may include an oxide or a nitride. For example, each of the insulating layers may include a silicon oxide or a silicon nitride.

Each of the first to third redistribution patterns 101, 103, and 105 may include a conductive line pattern and a conductive via pattern. For example, the first to third redistribution patterns 101, 103, and 105 may respectively include first to third conductive line patterns 121, 123, and 125, and first to third conductive via patterns 131, 133, and 135. The conductive line patterns may be disposed on at least one of the upper and lower surfaces of each of the insulating layers. The conductive via patterns may penetrate at least one of the insulating layers. The conductive via patterns may be connected to at least one of the conductive line patterns or to the lower bump pad 150.

Each of the first to third redistribution patterns 101, 103, and 105 may include a seed layer. The seed layers may be interposed between any one of the insulating layers and any one of the conductive line patterns, and may be interposed between any one of the insulating layers and any one of the conductive via patterns.

In some embodiments, the seed layers of the first to third redistribution patterns 101, 103, and 105 may be formed by performing physical vapor deposition, and the conductive line patterns and the conductive via patterns may be formed by performing electroless plating.

For example, the seed layers of the first to third redistribution patterns 101, 103, and 105 may include copper (Cu), titanium (Ti), titanium tungsten (TiW), titanium nitride (TiN), tantalum (Ta), tantalum nitride (TaN), chromium (Cr), aluminum (Al), or a combination thereof. In some embodiments, the seed layers may be Cu/Ti having copper stacked on titanium or Cu/TiW having copper stacked on titanium tungsten. However, embodiments of the seed layers are not limited to these materials.

The conductive line patterns and the conductive via patterns of the first to third redistribution patterns 101, 103, and 105 may include a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), etc. or an alloy thereof, but embodiments are not limited thereto. In some embodiments, when the conductive line patterns and the conductive via patterns are formed of copper (Cu), at least some of the seed layers may serve as a diffusion barrier layer.

The lower bump pad 150 may be provided in the redistribution insulating layer 110. An external connection bump 400 may be attached on the lower bump pad 150. The lower bump pad 150 may function as an under bump metallurgy (UBM) in which the external connection bump 400 is disposed. The semiconductor package 10 may be electrically connected to and mounted on a module board or a system board of an electronic product through the external connection bump 400.

For example, the lower bump pad 150 may include a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), etc. or an alloy thereof but embodiments are not limited thereto.

The configuration of the redistribution structure 100 is in more detail as follows.

The redistribution insulating layer 110 may include a first insulating layer 111, a second insulating layer 113, a third insulating layer 115, and a fourth insulating layer 117 that are sequentially stacked. The first redistribution pattern 101 may include a first conductive line pattern 121, a first conductive via pattern 131, and a first seed layer 141. The second redistribution pattern 103 may include a second conductive line pattern 123, a second conductive via pattern 133, and a second seed layer 143. The third redistribution pattern 105 may include a third conductive line pattern 125, a third conductive via pattern 135, and a third seed layer 145.

The first insulating layer 111 may include a pad opening 111O that exposes the lower bump pad 150. The external connection bump 400 may be formed to at least partially fill the pad openings 111O and may be in physical contact with the lower bump pad 150 exposed through the pad opening 111O.

The lower bump pad 150 may include a first surface 158 and a second surface 159, which are opposite to each other. The first surface 158 of the lower bump pad 150 may be in physical contact with the external connection bump 400. The second surface 159 of the lower bump pad 150 may be in physical contact with the first conductive via pattern 131.

When a part of the external connection bump 400 at least partially filling the pad opening 111O of the first insulating layer 111 is referred to as a first part of the external connection bump 400, the first part of the external connection bump 400 may have a shape in which the width in the horizontal direction gradually increases downward. That is, the first part of the external connection bump 400 may have a shape in which the width in the horizontal direction gradually increases away from the first surface 158 of the lower bump pad 150 as shown in FIG. 2.

In some embodiments, the first surface 158 and/or the second surface 159 of the lower bump pad 150 may have a substantially flat shape.

In some embodiments, the lower bump pad 150 may have an overall uniform thickness. In some embodiments, a thickness 150T of the lower bump pad 150 may be between about 3 µm and about 20 µm.

The first surface 158 of the lower bump pad 150 may be partially covered by the redistribution insulating layer 110. For example, a central portion of the first surface 158 of the lower bump pad 150 may be in physical contact with the external connection bump 400, and an edge portion of the first surface 158 of the lower bump pad 150 may be in physical contact with the upper surface of the first insulating layer 111.

In some embodiments, a distance 190 between the first surface 158 of the lower bump pad 150 and the lower surface 119 of the redistribution insulating layer 110 may be between about 3 µm and about 20 µm. When the distance 190 between the first surface 158 of the lower bump pad 150 and the lower surface 119 of the redistribution insulating layer 110 is less than 3 µm, the first surface of the lower bump pad 150 may not be sufficiently covered by the redistribution insulating layer 111, which may cause a crack to occur around the lower bump pad 150 due to stress. In addition, when the distance 190 between the first surface 158 of the lower bump pad 150 and the lower surface 119 of the redistribution insulating layer 110 is greater than 20 µm, the external connection bump 400 may not be sufficiently filled in the pad opening 111O, which may cause deterioration of an adhesive force between the external connection bump 400 and the lower bump pad 150 or between the external connection bump 400 and the side wall of the pad opening 111O.

In some embodiments, the redistribution structure 100 may include the lower seed layer 147 interposed between an edge portion of the first surface 158 of the lower bump pad 150 and an upper surface of the first insulating layer 111.

The lower seed layer 147 may include, for example, copper (Cu), titanium (Ti), titanium tungsten (TiW), titanium nitride (TiN), tantalum (Ta), tantalum nitride (TaN), chromium (Cr), aluminum (Al), or a combination thereof.

The lower seed layer 147 may have a ring shape continuously extending along the edge of the lower bump pad 150 as illustrated in FIG. 3. The lower seed layer 147 may be in physical contact with the sidewall of the external connection bump 400 and may border or at least partially surround the sidewall of the external connection bump 400.

In some embodiments, the surface of the external connection bump 400 and the surface of the lower seed layer 147 which are in physical contact with the first surface 158 of the lower bump pad 150 may be coplanar with each other.

The second insulating layer 113 including a first via opening VO1 exposing a part of the second surface 159 of the lower bump pad 150 may be stacked on the first insulating layer 111. The first seed layer 141 may be formed on a part of the upper surface of the second insulating layer 113, a sidewall of the first via opening VO1, and a part of the second surface 159 of the lower bump pad 150 exposed through the first via opening VO1. A part of the first seed layer 141 may be interposed between the first conductive line pattern 121 and the upper surface of the second insulating layer 113, and another part of the first seed layer 141 may border or at least partially surround the sidewall of the first conductive via pattern 131 and may be interposed between the first conductive via pattern 131 and the second surface 159 of the lower bump pad 150.

The first conductive line pattern 121 and the first conductive via pattern 131 may be disposed on the first seed layer 141. The first conductive line pattern 121 and the first conductive via pattern 131 may be formed together through a plating process, and may be integral with each other, i.e., they may form a monolithic structure. The first conductive line pattern 121 may be disposed on a part of the first seed layer 141 on the upper surface of the second insulating layer 113 and on the first conductive via pattern 131. The first conductive via pattern 131 may be on and at least partially cover a part of the first seed layer 141 in the first via opening VO1 and may at least partially fill the first via opening VO1. The first conductive via pattern 131 may extend in the vertical direction through the second insulating layer 113 and be connected to each of the first conductive line pattern 121 and the lower bump pad 150.

In some embodiments, the first conductive via pattern 131 may have a shape in which the width in the horizontal direction gradually increases upward as shown in FIG. 2. That is, the first conductive via pattern 131 may have a shape in which the width in the horizontal direction gradually increases as a distance from the second surface 159 of the lower bump pad 150 increases.

The third insulating layer 115 at least partially covering a part of the first conductive line pattern 121 and including a second via opening (see VO2 in FIG. 8F) exposing the remaining part of the first conductive line pattern 121 may be stacked on the second insulating layer 113.

The second conductive line pattern 123 may extend on the upper surface of the third insulating layer 115 in the horizontal direction, and the second conductive via pattern 133 may be formed to at least partially fill the second via opening VO2. The second seed layer 143 may be formed between the second conductive line pattern 123 and the third insulating layer 115, between the second conductive via pattern 133 and the sidewall of the second via opening VO2, and between the second conductive via pattern 133 and the first conductive line pattern 121. The second conductive line pattern 123, the second conductive via pattern 133, and the second seed layer 143 may be substantially the same as or similar to the first conductive line pattern 121, the first conductive via pattern 131, and the first seed layer 141, and, thus, detailed descriptions thereof will be omitted.

The fourth insulating layer 117 on and covering a part of the second conductive line pattern 123 and including a third via opening (see VO3 in FIG. 8F) at least partially exposing the remaining part of the second conductive line pattern 123 may be stacked on the third insulating layer 115.

The third conductive line pattern 125 may extend on the upper surface of the fourth insulating layer 117 in the horizontal direction, and the third conductive via pattern 135 may be formed to at least partially fill the third via opening VO3. The third seed layer 145 may be formed between the third conductive line pattern 125 and the fourth insulating layer 117, between the third conductive via pattern 135 and the sidewall of the third via opening VO3, and between the third conductive via pattern 135 and the second conductive line pattern 123. The third conductive line pattern 125, the third conductive via pattern 135, and the third seed layer 145 may be substantially the same as or similar to the first conductive line pattern 121, the first conductive via pattern 131, and the first seed layer 141, and, thus, detailed descriptions thereof will be omitted.

In FIG. 1, the redistribution structure 100 includes the four insulating layers 111, 113, 115, and 117, the three conductive line patterns 121, 131, and 141, and the three conductive via patterns 123, 133, and 143 but embodiments of the inventive concept are not limited thereto. The number of insulating layers, the number of conductive line patterns, and the number of conductive via patterns may be variously modified according to the design of circuit wiring in the redistribution structure 100.

The semiconductor chip 200 may be attached on the redistribution structure 100. For example, the semiconductor chip 200 may be mounted on the redistribution structure 100 in a flip chip manner.

The semiconductor chip 200 may be a memory chip or a logic chip. The memory chip may be, for example, a volatile memory chip, such as a dynamic random access memory (DRAM) or a static random access memory (SRAM), or a nonvolatile memory chip, such as a phase-change random access memory (PRAM), a magnetoresistive random access memory (MRAM), a ferroelectric random access memory (FeRAM), or a resistive random access memory (RRAM). In some embodiments, the memory chip may be a high bandwidth memory (HBM) DRAM semiconductor chip. In addition, the logic chip may be, for example, a microprocessor, an analog device, or a digital signal processor.

The semiconductor chip 200 may include a semiconductor substrate 210 and a chip pad 220 disposed on one surface of the semiconductor substrate 210.

The semiconductor substrate 210 may include, for example, silicon (Si). In other embodiments, the semiconductor substrate 210 may include a semiconductor element, such as germanium (Ge) or a compound semiconductor, such as silicon carbide (SiC), gallium arsenide (GaAs), indium arsenide (InAs), and indium phosphide (InP). The semiconductor substrate 210 may include an active surface and an inactive surface opposite to the active surface. In some embodiments, the active surface of the semiconductor substrate 210 may face the redistribution structure 100. The semiconductor chip 200 may include a semiconductor device including a plurality of individual devices of various kinds on the active surface of the semiconductor substrate 210.

In some embodiments, the semiconductor package 10 is a semiconductor package of a fan-out structure, and the footprint occupied by the semiconductor chip 200 is smaller than the footprint of the redistribution structure 100. In this case, at least one of the lower bump pads 150 may be disposed at a position spaced outward from the side surface of the semiconductor chip 200.

A chip connection terminal 230 may be disposed between the chip pad 220 of the semiconductor chip 200 and the third conductive line pattern 125. The chip connection terminal 230 may electrically connect the chip pad 220 of the semiconductor chip 200 and the third conductive line pattern 125. The chip connection terminal 230 may include, for example, at least one of a pillar structure, solder bumps, a solder ball, and/or a solder layer.

The semiconductor chip 200 may receive at least one of a control signal, a power signal, and/or a ground signal for operating the semiconductor chip 200 or a data signal to be stored in the semiconductor chip 200 from the outside of the semiconductor package 10, e.g., from an external source, or provide data stored in the semiconductor chip 200 to the outside of semiconductor package 10, e.g., to an external source, through the chip connection terminal 230, the first to third redistribution patterns 101, 103, and 105, the lower bump pad 150, and the external connection bump 400.

An underfill material layer 240 bordering and at least partially surrounding the chip connection terminal 230 may be provided between the semiconductor chip 200 and the redistribution structure 100. The underfill material layer 240 may include, for example, an epoxy resin formed by using a capillary under-fill method. In some embodiments, the underfill material layer 240 may be a non-conductive film (NCF).

The molding layer 300 may be disposed on an upper surface 118 of the redistribution structure 100 and may be on and cover at least a part of the semiconductor chip 200. The molding layer 300 may include, for example, an epoxy molding compound (EMC). Embodiments of the molding layer 300 are not limited to the EMC, and may include various materials, for example, epoxy-based materials, thermosetting materials, thermoplastic materials, and/or UV treatment materials, etc.

In some embodiments, the molding layer 300 may be on and cover a part of the upper surface 118 of the redistribution insulating layer 110 and may at least partially cover the side surface of the semiconductor chip 200. The top surface of the molding layer 300 may be coplanar with an upper surface of the semiconductor chip 200. In such embodiments, the upper surface of the semiconductor chip 200 may be exposed to the outside.

In addition, although not shown in the drawings, a heat dissipating member may be attached to the upper surface of the semiconductor chip 200. The heat dissipating member may be, for example, a heat slug or a heat sink. In embodiments, a thermal interface material (TIM) may be disposed between the heat dissipating member and the upper surface of the semiconductor chip 200. The TIM may be, for example, mineral oil, grease, gap filler putty, phase change gel, phase change material pads, and/or particle filled epoxy.

In other embodiments, the molding layer 300 may be formed to have an over-mold structure at least partially covering the upper surface of the semiconductor chip 200.

Figure 4:
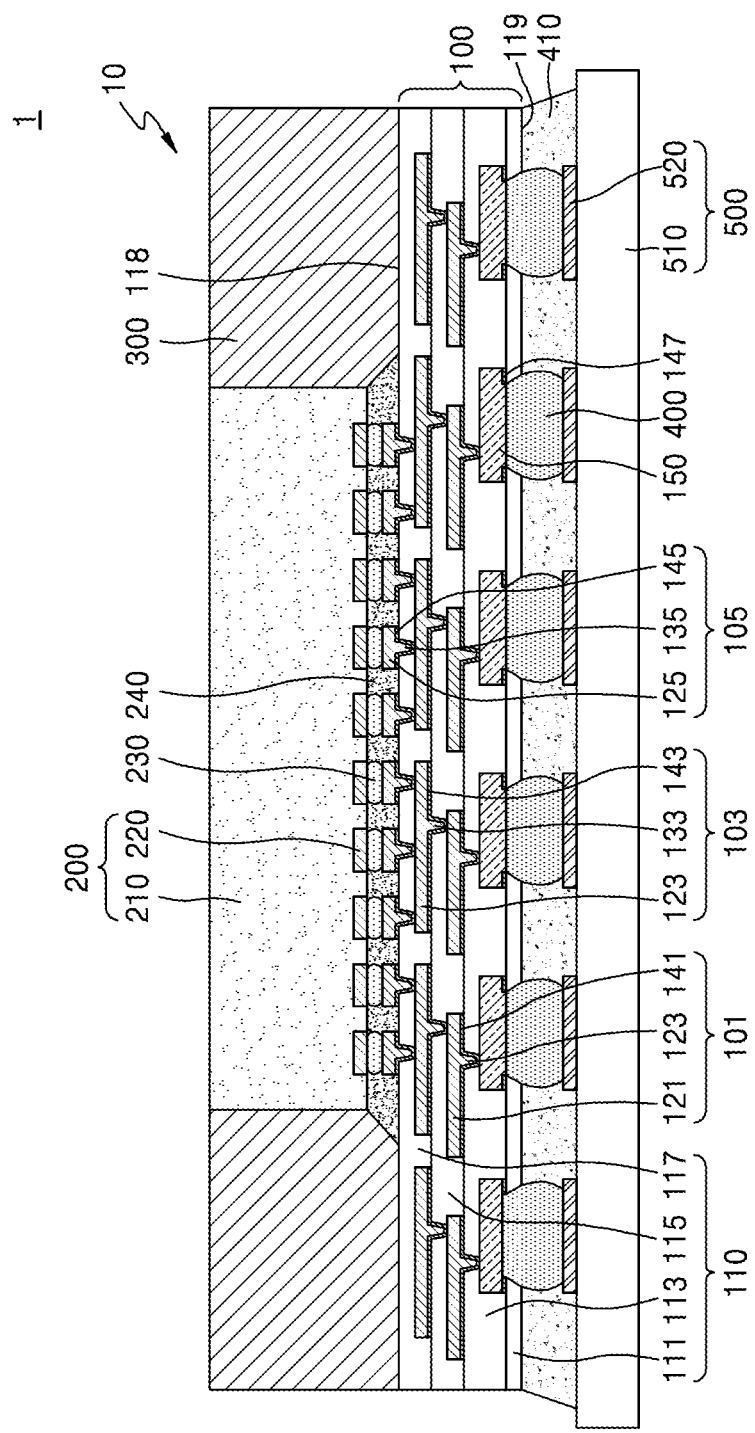
FIG. 4 is a cross-sectional view illustrating a semiconductor module according to some embodiments of the inventive concept.
Figure 5:
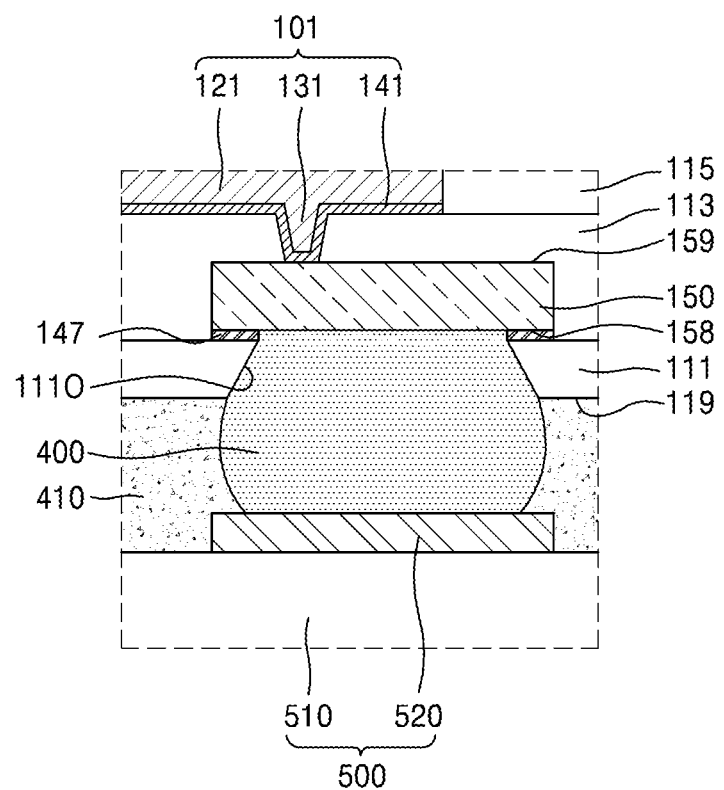
FIG. 5 is an enlarged cross-sectional view of a part of the semiconductor module of FIG. 4.

FIG. 4 is a cross-sectional view illustrating a semiconductor module 1 according to some embodiments of the inventive concept. FIG. 5 is an enlarged cross-sectional view of a part of the semiconductor module 1 of FIG. 4.

Referring to FIGS. 4 and 5, the semiconductor module 1 may include a module substrate 500 and the semiconductor package 10 mounted on the module substrate 500.

The module substrate 500 may include a body portion 510 and a wiring 520. A part of the wiring 520 may function as a substrate pad on which the external connection bump 400 is mounted. For example, the module substrate 500 may be a printed circuit board (PCB). When the module substrate 500 is a PCB, the body portion 510 of the module substrate 500 may be formed in a thin shape by compressing a polymer material, such as a thermosetting resin, an epoxy resin, such as flame retardant 4 (FR-4), Bisaleimide Triazine (BT), an Ajinomoto buildup film (ABF), and/or a phenol resin, etc. to a predetermined thickness, and the wiring 520, which is a transmission path of the electrical signal may be formed by patterning a copper foil on the surface of the body portion 510.

In FIG. 4, embodiments of the module substrate 500 is illustrated as a single layer PCB in which the wiring 520 is formed only on one side of the module substrate 500, but the module substrate 500 may be implemented as a double layer PCB in which the wiring 520 is formed on both sides thereof in other embodiments. Embodiments of the module substrate 500 are not limited to the structure or material of the PCB described above.

The semiconductor package 10 may be mounted on an upper surface of the module substrate 500. The external connection bump 400 may be disposed between the wiring 520 on the upper surface of the module substrate 500 and the lower bump pad 150. The external connection bump 400 may be in physical contact with each of the wiring 520 of the module substrate 500 and the lower bump pad 150 to electrically connect the wiring 520 of the module substrate 500 and the lower bump pad 150. An underfill layer 410 bordering and at least partially surrounding the external connection bump 400 may be provided between the semiconductor package 10 and the module substrate 500. The underfill layer 410 may be omitted in some embodiments.

In a general semiconductor package, an edge part of the UBM is at least partially exposed from an insulating layer around thereof, and stress may be concentrated on a part where the edge of the UBM meets the solder ball that is the external connection bump 400 by repetitive shrinking or relaxation of the underfill layer 410 or the solder ball. Such stress may be manifest as a growing crack that propagates along the sidewall of the UBM, which may result in problems due to the UBM and the redistribution of the semiconductor package being damaged by the crack.

However, according to some embodiments of the inventive concept, because the edge portion of the first surface 158 of the lower bump pad 150 is at least partially covered by the redistribution insulating layer 110, a phenomenon in which stress is concentrated on an interface of the lower bump pad 150 and the external connection bump 400 may be alleviated. The crack may be reduced in size or prevented from occurring around the lower bump pad 150, which may reduce or prevent damage to the lower bump pad 150 and the redistribution patterns 101, 103, and 105. Ultimately, bonding reliability between the semiconductor package 10 and the module substrate 500 may be improved, and the board level reliability may be improved.

Figure 6:
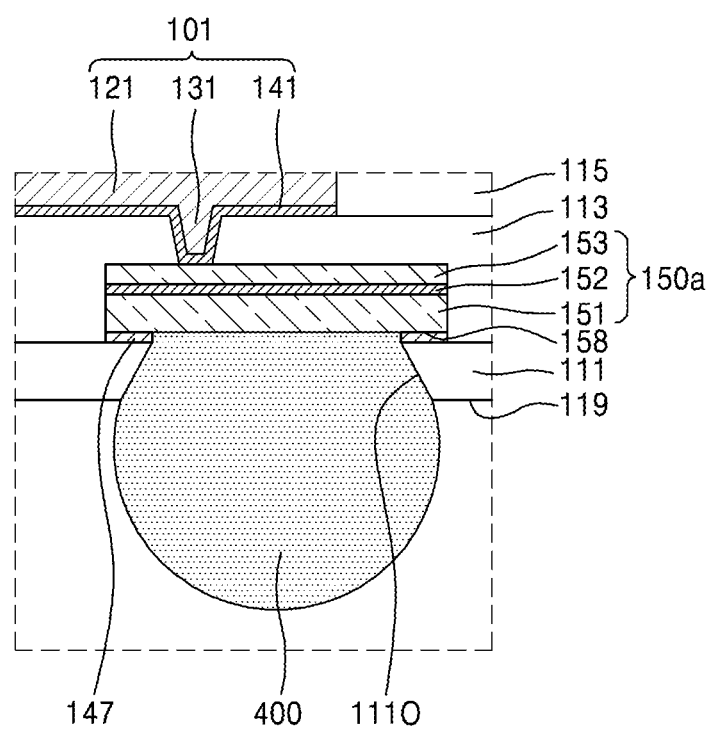
FIG. 6 is a cross-sectional view illustrating a part of a semiconductor package according to some embodiments of the inventive concept.

FIG. 6 is a cross-sectional view illustrating a part of a semiconductor package according to some embodiments of the inventive concept. In FIG. 6, a partial region of the semiconductor package corresponding to a region indicated by "II" of FIG. 1 is illustrated. The semiconductor package illustrated in FIG. 6 may be substantially the same as or similar to the semiconductor package 10 described with reference to FIGS. 1 to 3 except for the structure of a lower bump pad 150a. For convenience of description, the above description will be briefly described or omitted, and differences between the semiconductor package of FIG. 6 and the semiconductor package 10 described with reference to FIGS. 1 to 3 will be described.

Referring to FIG. 6, the lower bump pad 150a may include a first conductive layer 151 in physical contact with the external connection bump 400, a second conductive layer 153 in physical contact with the first conductive via pattern 131, and a conductive barrier layer 152 disposed between the first conductive layer 151 and the second conductive layer 153.

Each of the first conductive layer 151 and the second conductive layer 153 may include a metal, such as copper (Cu), aluminum (Al), tungsten (W), titanium (Ti), tantalum (Ta), indium (In), and molybdenum (Mo), manganese (Mn), cobalt (Co), tin (Sn), nickel (Ni), magnesium (Mg), rhenium (Re), beryllium (Be), gallium (Ga), ruthenium (Ru), etc. or alloys thereof.

In some embodiments, the first conductive layer 151 and the second conductive layer 153 may include the same material. For example, the first conductive layer 151 and the second conductive layer 153 may each include copper (Cu).

In some embodiments, each of the first conductive layer 151 and the second conductive layer 153 may have an overall uniform thickness. In some embodiments, the thickness of the first conductive layer 151 may be greater than the thickness of the second conductive layer 153.

The conductive barrier layer 152 may be interposed between the first conductive layer 151 and the second conductive layer 153. The first conductive layer 151 and the second conductive layer 153 may be spaced apart from each other by the conductive barrier layer 152. The conductive barrier layer 152 may serve as a diffusion barrier layer that serves to reduce or prevent material diffusion between the first conductive layer 151 and the second conductive layer 153. The conductive barrier layer 152 may include, for example, nickel (Ni), titanium (Ti), titanium nitride (TiN), tantalum (Ta), tantalum nitride (TaN), or a combination thereof. The conductive barrier layer 152 may reduce or prevent the material constituting the second conductive layer 153 from diffusing to the external connection bump 400, thereby suppressing resistance increase between the second conductive layer 153 and the first conductive via pattern 131 and leakage current.

In some embodiments, the horizontal width of the conductive barrier layer 152 may be the same as the horizontal width of the first conductive layer 151 and the horizontal width of the second conductive layer 153 as shown in FIG. 6. In this case, the sidewalls of the conductive barrier layer 152, the sidewalls of the first conductive layer 151, and the sidewalls of the second conductive layer 153 may constitute sidewalls of the lower bump pad 150a.

Figure 7:
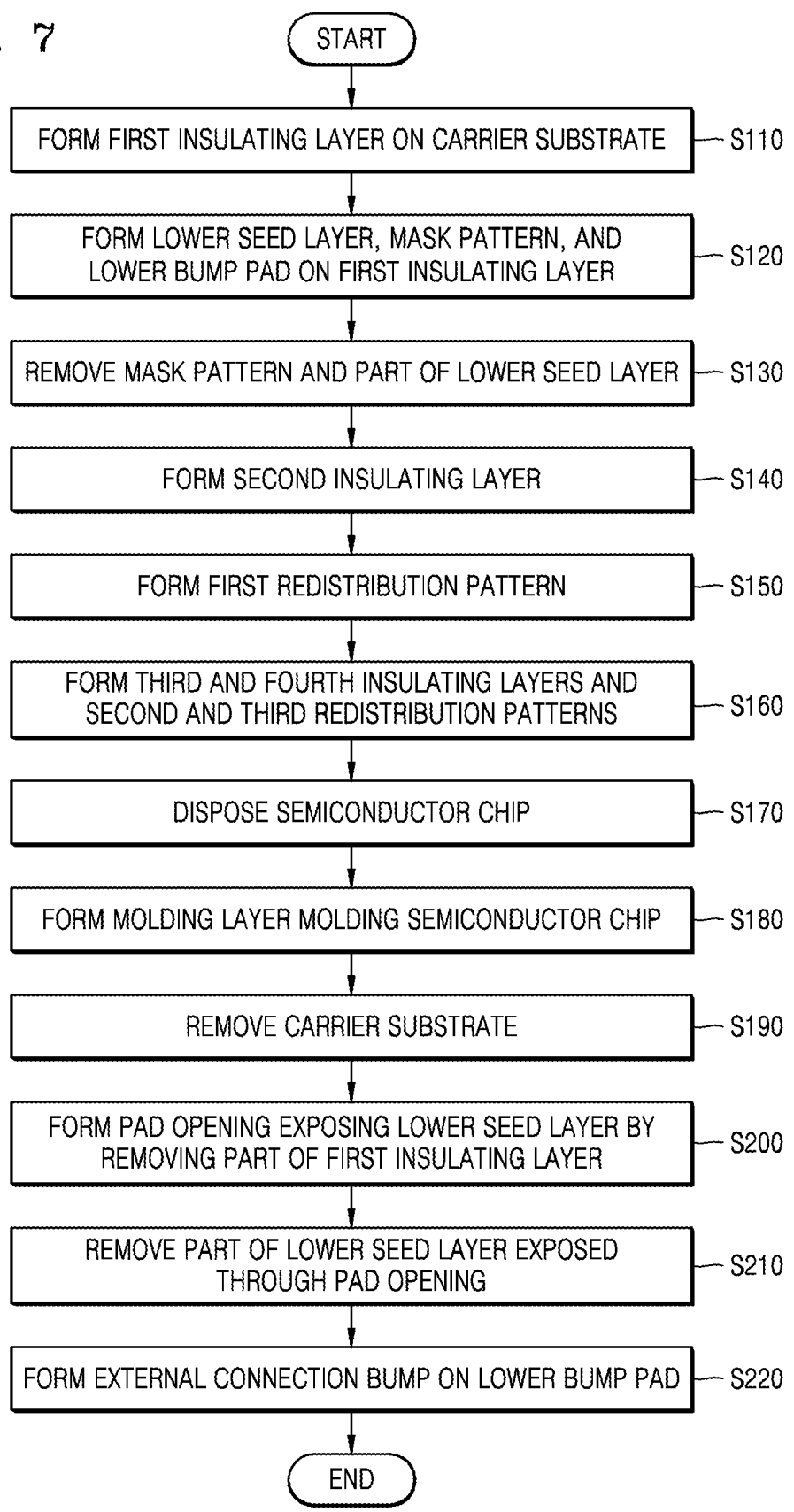
FIG. 7 is a flowchart illustrating a method of manufacturing a semiconductor package according to some embodiments of the inventive concept.

FIG. 7 is a flowchart illustrating a method of manufacturing a semiconductor package according to some embodiments of the inventive concept. FIGS. 8A through 8M are cross-sectional views sequentially illustrating a method of manufacturing the semiconductor package 10 according to some embodiments of the inventive concept. Hereinafter, the method of manufacturing the semiconductor package 10 illustrated in FIG. 1, according to some embodiments of the inventive concept, will be described with reference to FIGS. 7 and 8A to 8M.

Figure 8A:
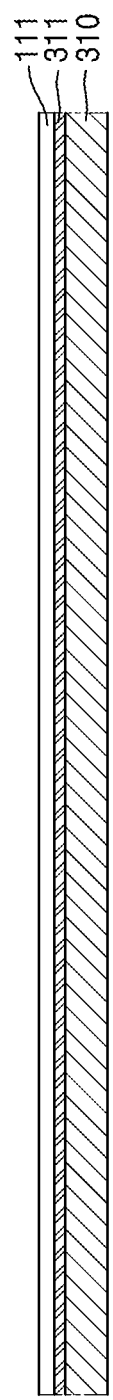
FIGS. 8A through 8M are cross-sectional views sequentially illustrating a method of manufacturing a semiconductor package according to some embodiments of the inventive concept.

Referring to FIGS. 7 and 8A, the first insulating layer 111 is formed on the carrier substrate 310 to which a release film 311 is attached (S110).

The carrier substrate 310 may include any material having stability with respect to a baking process and an etching process. When the carrier substrate 310 is to be separated and removed later by laser ablation, the carrier substrate 310 may be a light transmissive substrate. Selectively, when the carrier substrate 310 is to be separated and removed later by heating, the carrier substrate 310 may be a heat resistant substrate. In some embodiments, the carrier substrate 310 may be a glass substrate. Alternatively, in other embodiments, the carrier substrate 310 may include a heat resistant organic polymer material, such as polyimide (PI), polyetheretherketone (PEEK), polyethersulfone (PES), and/or polyphenylene sulfide (PPS), etc., but embodiments are not limited thereto.

The release film 311 may be, for example, a laser reaction layer that reacts to laser radiation and may evaporate, such that the carrier substrate 310 is separable. The release film 311 may include a carbon-based material layer. For example, the release film 311 may include an amorphous carbon layer (ACL).

Figure 8B:
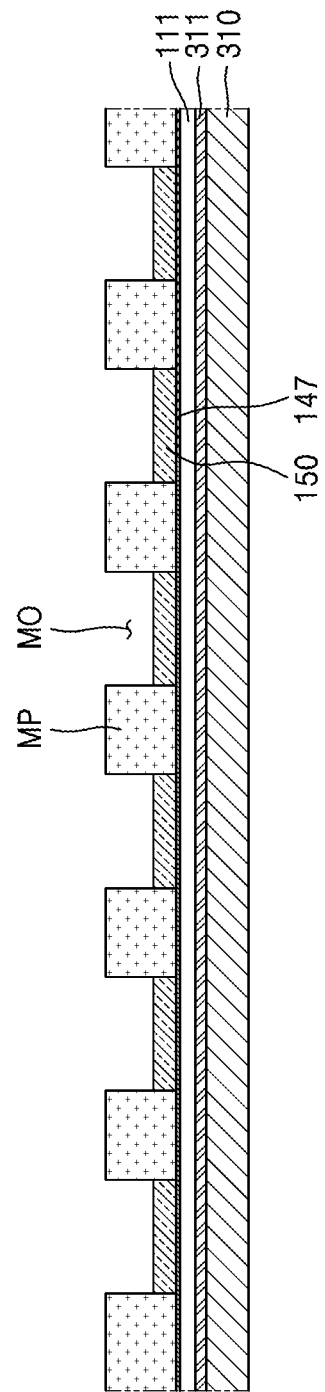

Referring to FIGS. 7 and 8B, the lower seed layer 147, a mask pattern MP, and the lower bump pad 150 are formed on the first insulating layer 111 (S120).

The lower seed layer 147 may be formed on the first insulating layer 111. The lower seed layer 147 may be formed through, for example, physical vapor deposition. The lower seed layer 147 may conformally extend on an upper surface of the first insulating layer 111.

The mask pattern MP may be formed on the lower seed layer 147 and may include a mask opening MO. The mask opening MO of the mask pattern MP may expose a part of the lower seed layer 147 and may define a region where the lower bump pad 150 is formed in a subsequent process.

The lower bump pad 150 may be formed on a part of the lower seed layer 147 exposed through the mask opening MO of the mask pattern MP. The lower bump pad 150 may be formed through a plating process using the lower seed layer 147 as a seed.

In such embodiments, the first surface (see 158 of FIG. 2) of the lower bump pad 150 in physical contact with the upper surface of the first insulating layer 111 may be formed to have a flat shape. In addition, the second surface (see 159 of FIG. 2) of the lower bump pad 150 opposite to the first surface 158 may also be formed to have a flat shape.

In some embodiments, as illustrated in FIG. 6, the lower bump pad 150a may have a multilayer structure, in which case, to form the lower bump pad 150a, the first conductive layer 151, the conductive barrier layer 152, and the second conductive layer 153 may be sequentially formed on the lower seed layer 147.

Figure 8C:
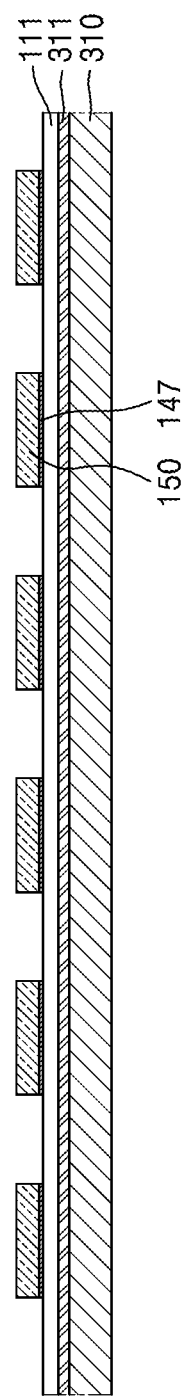

Referring to FIGS. 7 and 8C, the mask pattern (MP of FIG. 8B) is removed, and a part of the lower seed layer 147 exposed by removing the mask pattern MP is removed (S130). The mask pattern MP may be removed by, for example, a strip process, and the part of the lower seed layer 147 may be removed by an etching process. Another part of the lower seed layer 147 covered by the lower bump pad 150 may remain.

Figure 8D:
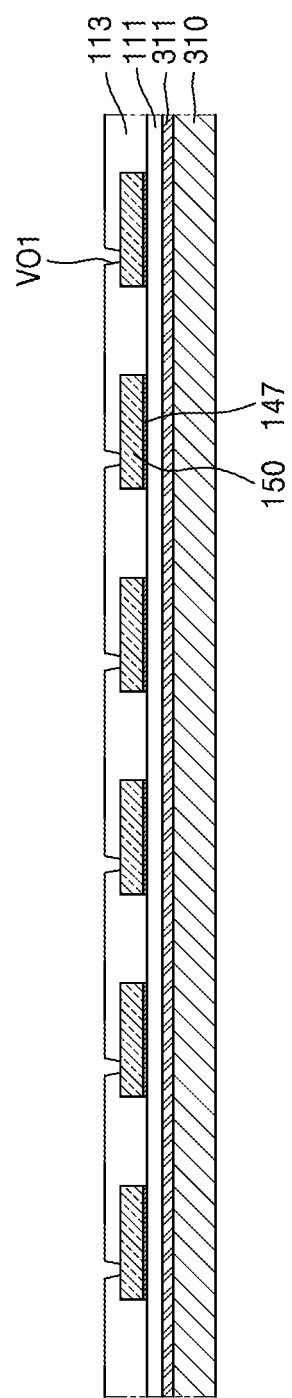

Referring to FIGS. 7 and 8D, the second insulating layer 113 including a first via opening VO1 exposing a part of the lower bump pad 150 is formed (S140). For example, to form the second insulating layer 113, an insulating material film at least partially covering the lower bump pad 150 and the first insulating layer 111 may be formed, and a part of the insulating material film may be removed using exposure and a development process to form the first via opening VO1. By the first via opening VO1, a part of the second surface (see 159 of FIG. 2) of the lower bump pad 150 may be exposed.

For example, to form the first via opening VO1, a reactive ion etching (RIE) process using plasma, laser drilling, etc. may be performed. The first via opening VO1 may have a shape in which the width gradually increases in the horizontal direction upward (or away from the second surface 159 of the lower bump pad 150).

Figure 8E:
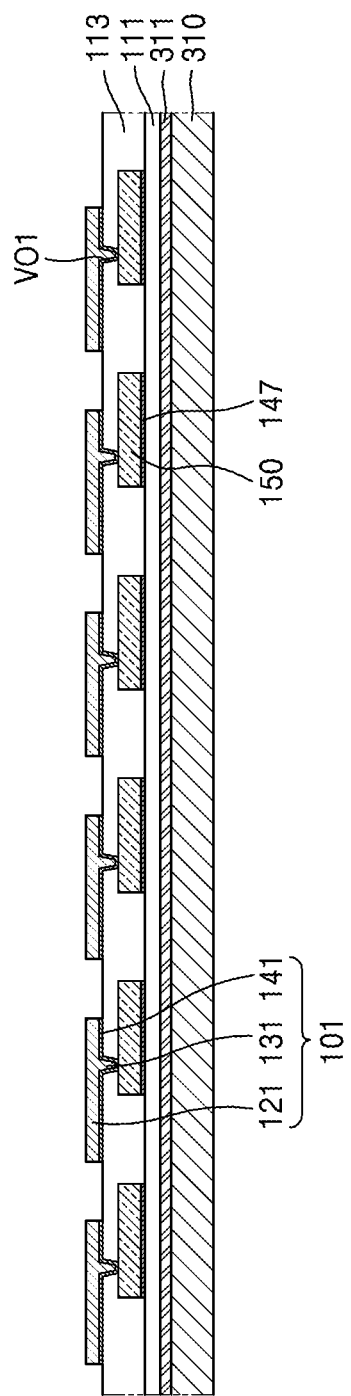

Referring to FIGS. 7 and 8E, the first redistribution pattern 101 including the first seed layer 141, the first conductive line pattern 121, and the first conductive via pattern 131 may be formed on a resultant of FIG. 8D (S150).

More specifically, the first seed layer 141 may be formed to at least partially cover the upper surface of the second insulating layer 113, an inner wall of the second insulating layer 113 provided by the first via opening VO1, and a part of the second surface (see 159 of FIG. 2) of the lower bump pad 150 exposed through the first via opening VO1. The first conductive line pattern 121 may extend along the upper surface of the second insulating layer 113, and the first conductive via pattern 131 may at least partially fill the first via opening VO1.

Figure 8F:
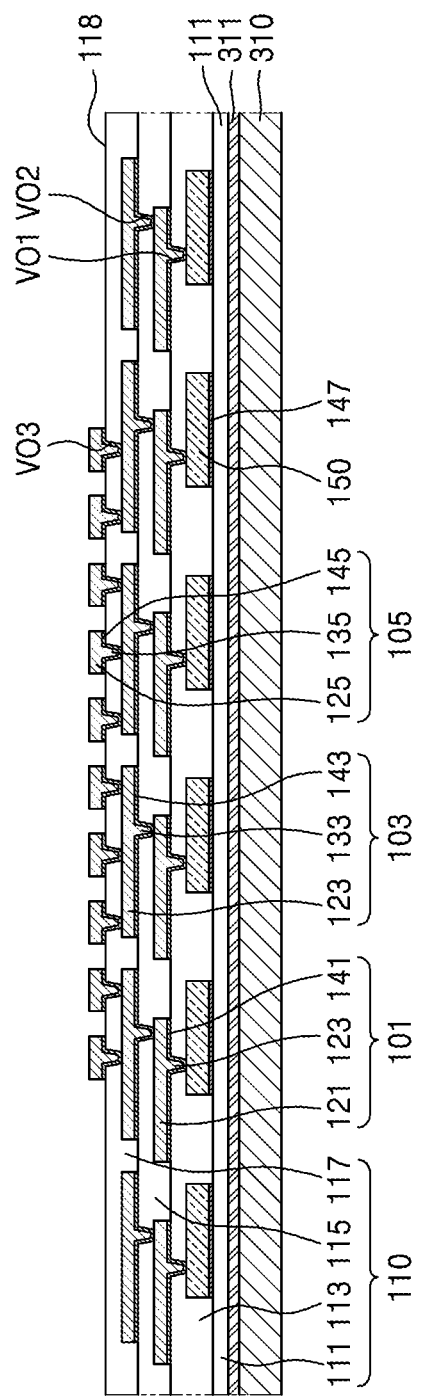

Referring to FIGS. 7 and 8F, the third and fourth insulating layers 115 and 117 and the second and third redistribution patterns 103 and 105 are formed on the resultant of FIG. 8E (S160). That is, the third insulating layer 115 including the second via opening VO2, the second redistribution pattern 103, the fourth insulating layer 117 including the opening VO3, and the third redistribution pattern 105 are sequentially formed through a process, which is substantially the same as or similar to that described with reference to FIGS. 8D and 8E.

More specifically, the second seed layer 143 may be formed to at least partially cover the upper surface of the third insulating layer 115, an inner wall of the third insulating layer 115 provided by the second via opening VO2, and a part of the first conductive line pattern 121 exposed through the second via opening VO2. The second conductive line pattern 123 may extend along the upper surface of the third insulating layer 115, and the second conductive via pattern 133 may at least partially fill the second via opening VO2. The second seed layer 143, the second conductive line pattern 123, and the second conductive via pattern 133 may constitute the second redistribution pattern 103.

In addition, the third seed layer 145 may be formed to at least partially cover an upper surface of the fourth insulating layer 117, an inner wall of the fourth insulating layer 117 provided by the third via opening VO3, and a part of the second conductive line pattern 123 exposed through the third via opening VO3. The third conductive line pattern 125 may extend along the upper surface of the fourth insulating layer 117, and the third conductive via pattern 135 may at least partially fill the third via opening VO3. The third seed layer 145, the third conductive line pattern 125, and the third conductive via pattern 135 may constitute the third redistribution pattern 105.

Figure 8G:
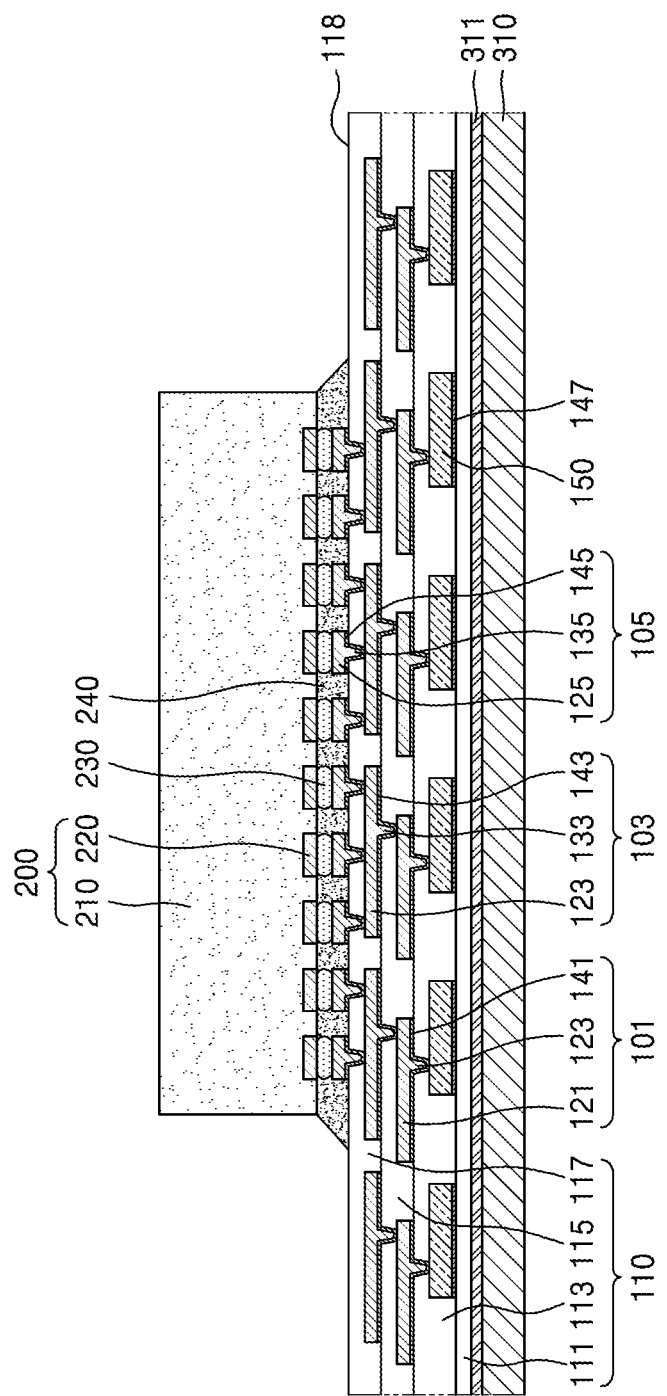

Referring to FIGS. 7 and 8G, the semiconductor chip 200 is disposed on the resultant structure of FIG. 8F (S170). The chip pad 220 of the semiconductor chip 200 may be connected to the third conductive line pattern 125 through the chip connection terminal 230. The chip pad 220 of the semiconductor chip 200 may be electrically connected to the third conductive line pattern 125 of the third redistribution pattern 105 through the chip connection terminal 230. After the semiconductor chip 200 is positioned, the underfill material layer 240 at least partially filling a space between the semiconductor chip 200 and the upper surface 118 of the redistribution insulating layer 110 is formed. The underfill material layer 240 may border and at least partially surround the chip connection terminal 230. For example, the underfill material layer 240 may be formed by using a capillary underfill method. In some embodiments, the underfill material layer 240 may be formed by attaching a non-conductive film onto the chip pad 220 of the semiconductor chip 200, and then, attaching the semiconductor chip 200 onto the upper surface of the redistribution insulating layer 110.

Figure 8H:
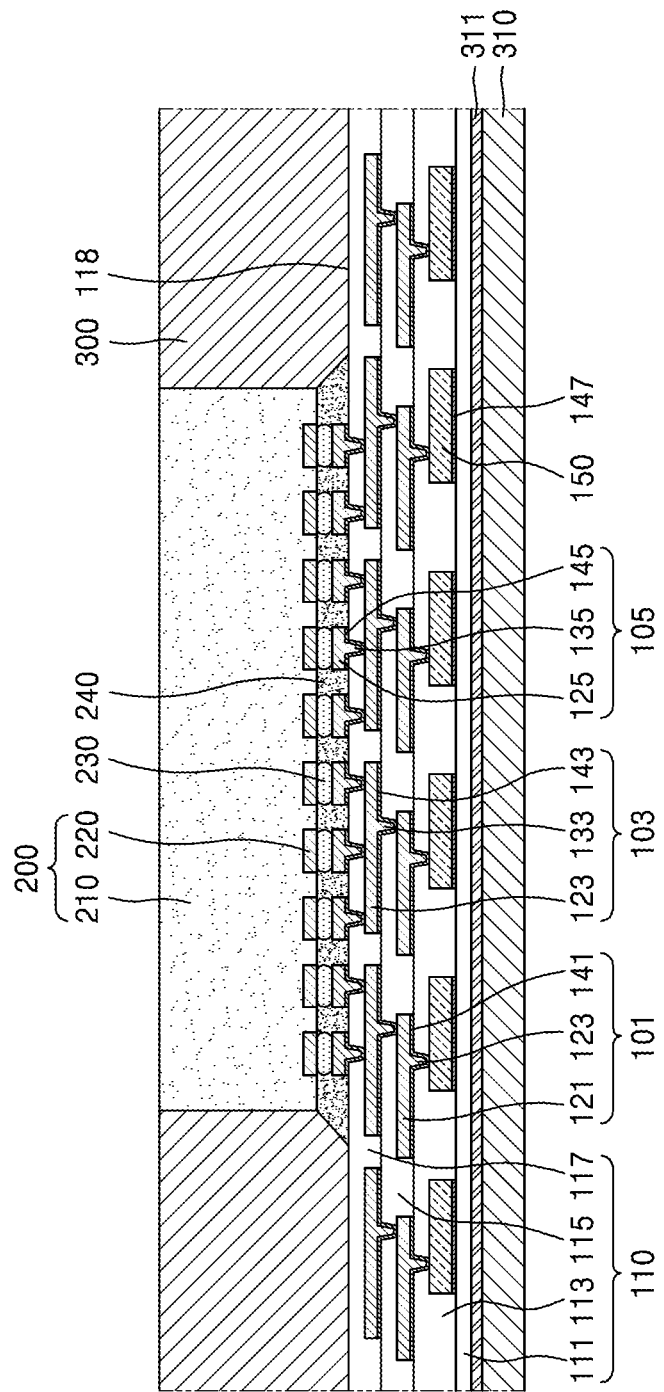

Referring to FIGS. 7 and 8H, the molding layer 300 molding the semiconductor chip 200 is formed (S180). The molding layer 300 may at least partially cover the side surface of the semiconductor chip 200 and may at least partially expose the upper surface of the semiconductor chip 200. In addition, the molding layer 300 may cover a part of the upper surface 118 of the redistribution insulating layer 110.

In other embodiments, the molding layer 300 may be formed to further at least partially cover the upper surface of the semiconductor chip 200.

Figure 8I:
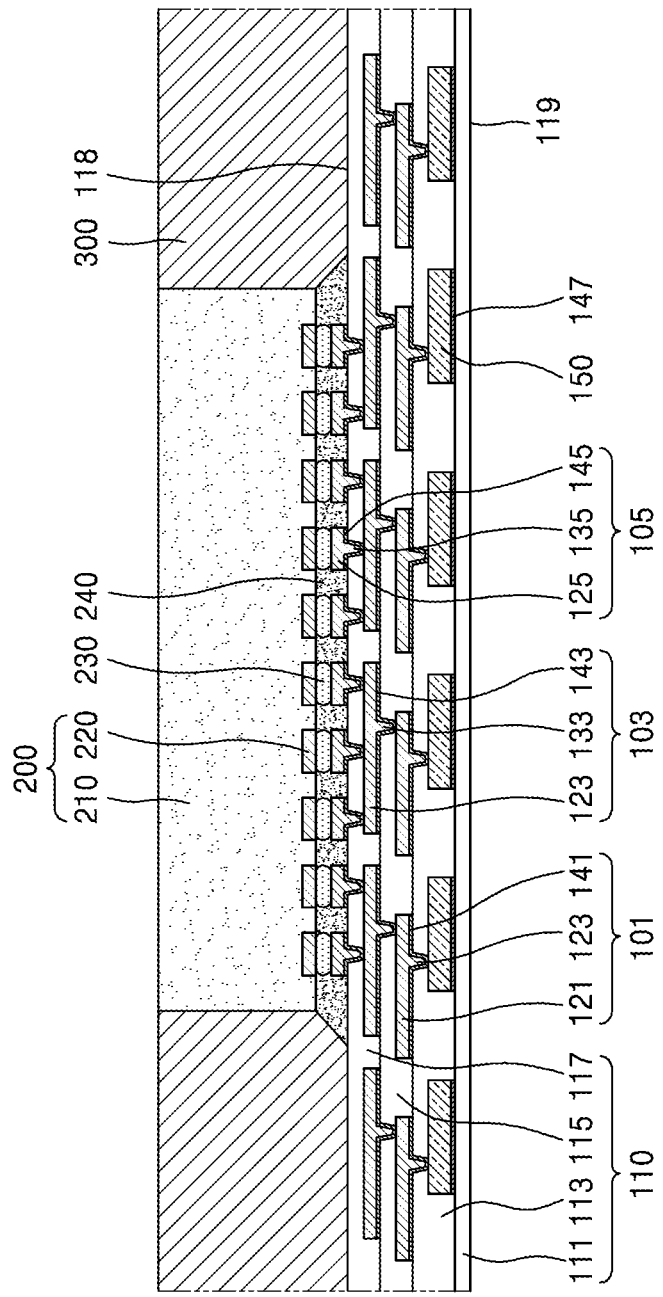

Referring to FIGS. 7, 8H, and 8I, after forming the molding layer 300, the carrier substrate 310 is removed (S190). For example, the carrier substrate 310 to which the release film 311 is attached is separated from the resultant of FIG. 8H. For example, to separate the carrier substrate 310, a laser may be used to irradiate the release film 311 or heat may be applied to the release film 311. As a result of separating the carrier substrate 310, the first insulating layer 111 may be at least partially exposed.

Figure 8J:
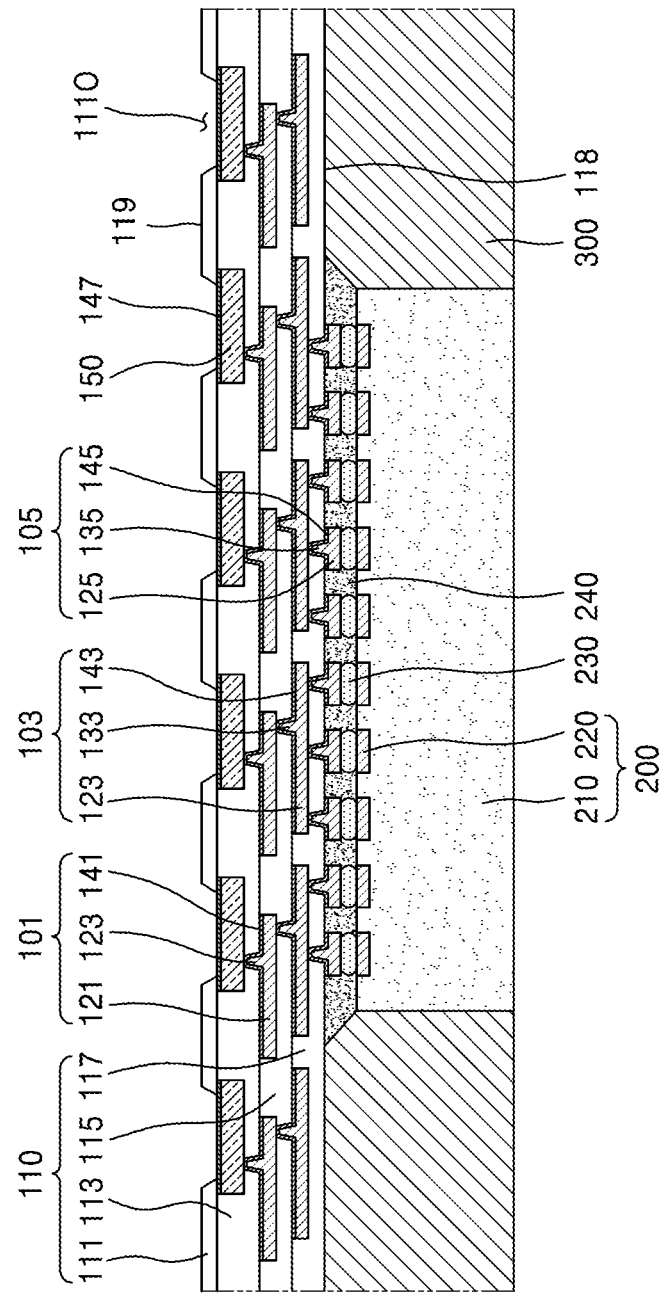

Referring to FIGS. 7 and 8J, after inverting the resultant structure of FIG. 8I, a pad opening 111O at least partially exposing the lower seed layer 147 by removing a part of the first insulating layer 111 may be formed (S200). For example, to form the pad opening 111O, an RIE process using plasma, laser drilling, etc. may be performed.

In some embodiments, the pad opening 111O may have a shape in which the width gradually increases in the horizontal direction as a distance from the lower bump pad 150 increases as shown in FIG. 8J. That is, an inner sidewall of the first insulating layer 111 provided by the pad opening 111O may have an inclined sidewall portion. For example, an angle between the inclined sidewall portion and a lower surface of the first insulating layer 111 may be greater than about 65 degrees and less than about 90 degrees.

Figure 8K:
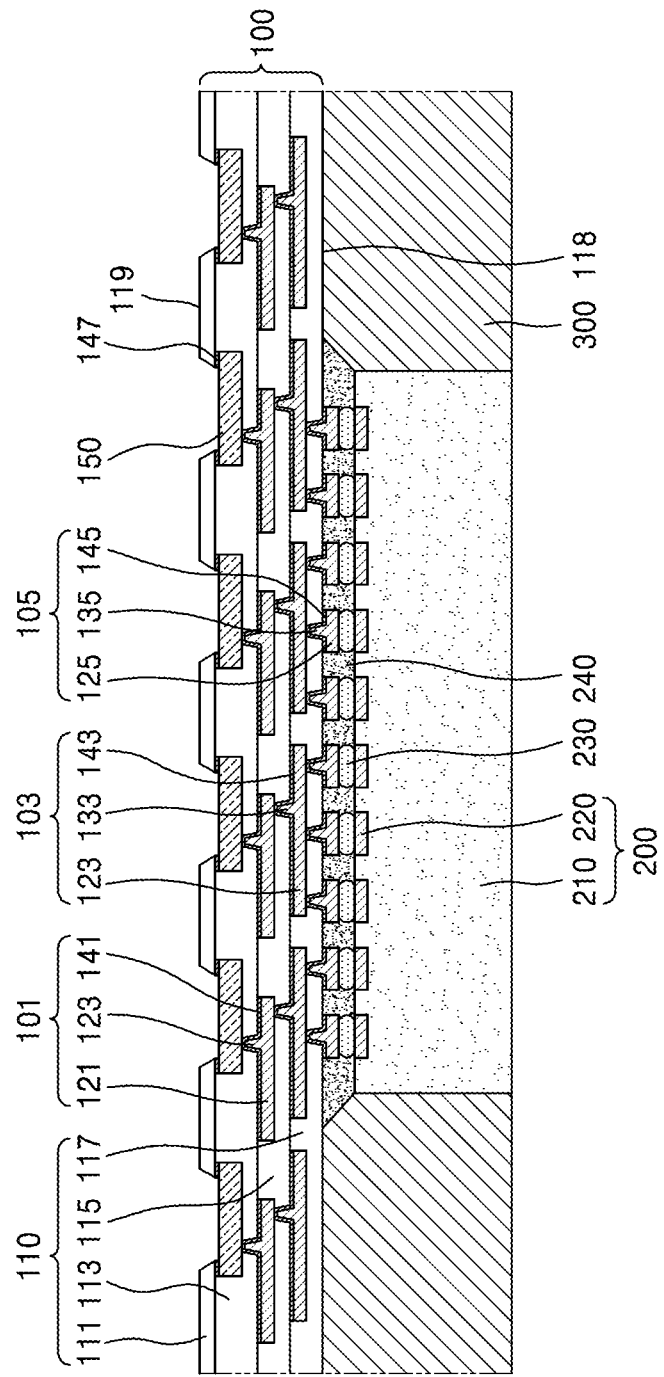

Referring to FIGS. 7 and 8K, a part of the lower seed layer 147 exposed through the pad opening 111O may be removed (S210). As the part of the lower seed layer 147 is removed, a part of the first surface (see 158 of FIG. 2) of the lower bump pad 150 may be exposed through the pad opening 111O. For example, wet etching may be performed to remove the part of the lower seed layer 147. Another part of the lower seed layer 147 covered by the first insulating layer 111 may remain to at least partially cover an edge portion of the first surface 158 of the lower bump pad 150. The first to fourth insulating layers 111, 113, 115, and 117, the first to third redistribution patterns 101, 103, and 105, the lower bump pad 150, and the lower seed layer 147 may form a redistribution structure 100.

Figure 8L:
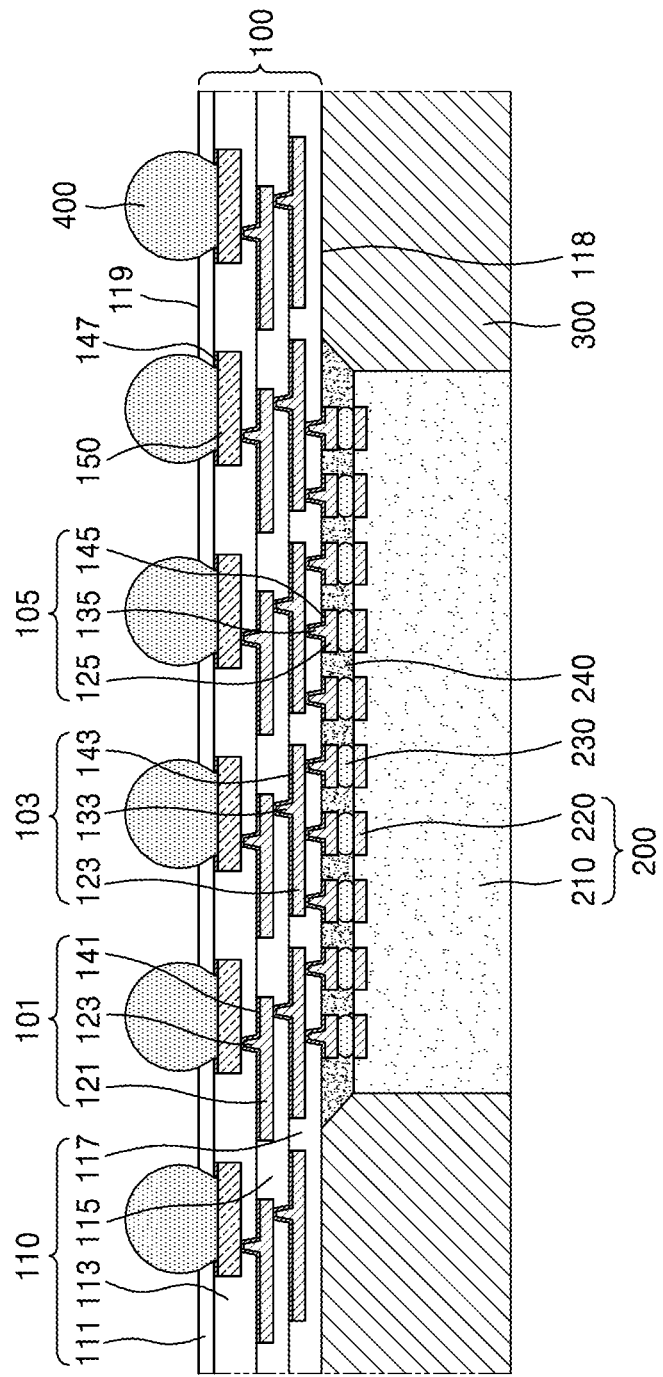

Referring to FIGS. 7 and 8L, the external connection bump 400 is formed on the lower bump pad 150 (S220). The external connection bump 400 may be formed to at least partially fill the pad opening 111O formed in the first insulating layer 111, and to be in physical contact with the first surface (see 158 of FIG. 2) of the lower bump pad 150 exposed through the pad opening 111O. The external connection bumps 400 may be, for example, a solder ball or a bump. For example, the external connection bump 400 may be formed in physical contact with the lower bump pad 150 by positioning or placing the solder ball on the first surface 158 of the lower bump pad 150 exposed through the pad opening 111O through a solder ball attach process, and then melting the solder ball through a reflow process.

Figure 8M:
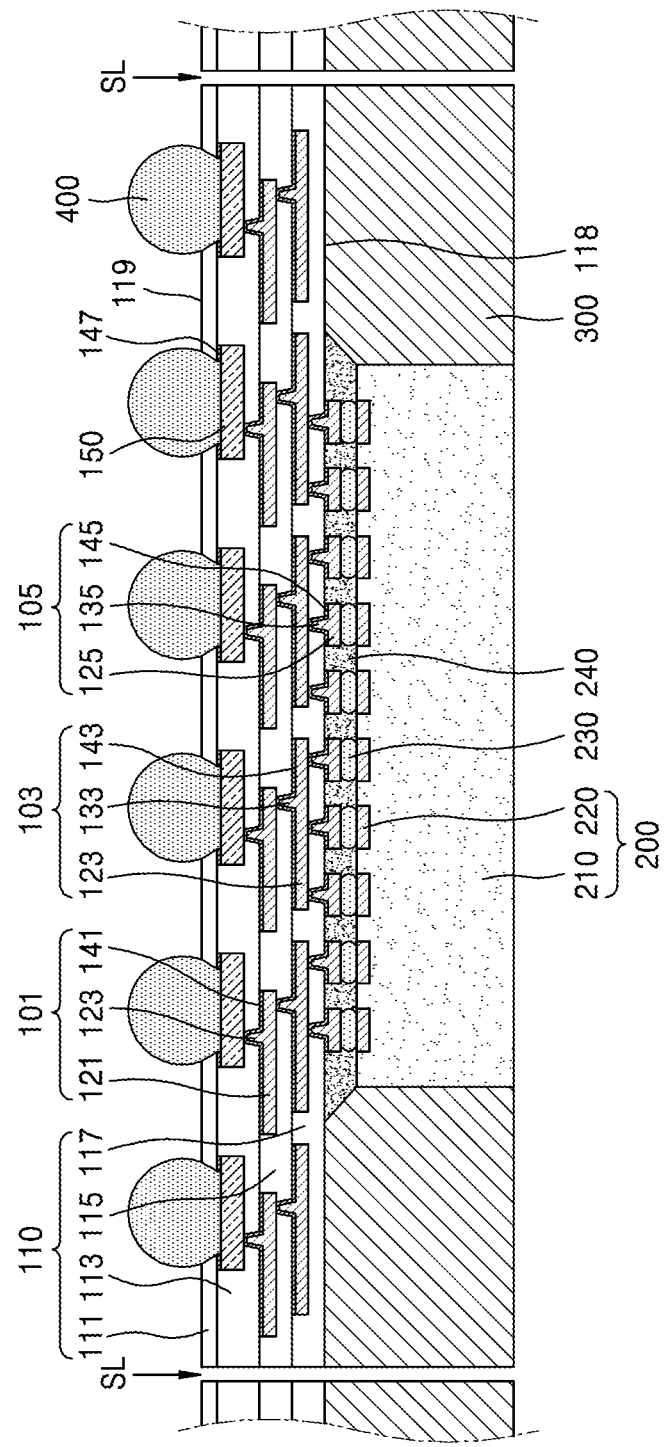

Referring to FIG. 8M, after the external connection bump 400 is formed, the individualized semiconductor package 10 as illustrated in FIG. 1 may be completed through a singulation process of cutting the resultant structure of FIG. 8L along a scribe lane SL.

In general, the chip last method of manufacturing a semiconductor package may be performed in the order of redistribution pattern formation, chip attachment, UBM formation, and solder ball attach. However, according to the method of manufacturing the semiconductor package according to some embodiments of the inventive concept, the lower bump pad 150 functioning as the UBM may be formed before a redistribution pattern is formed, thereby simplifying the process and reducing the production cost.

FIGS. 9A through 9G are cross-sectional views sequentially illustrating a method of manufacturing a semiconductor package according to some embodiments of the inventive concept. For convenience of description, the above description will be briefly described or omitted.

Figure 9A:
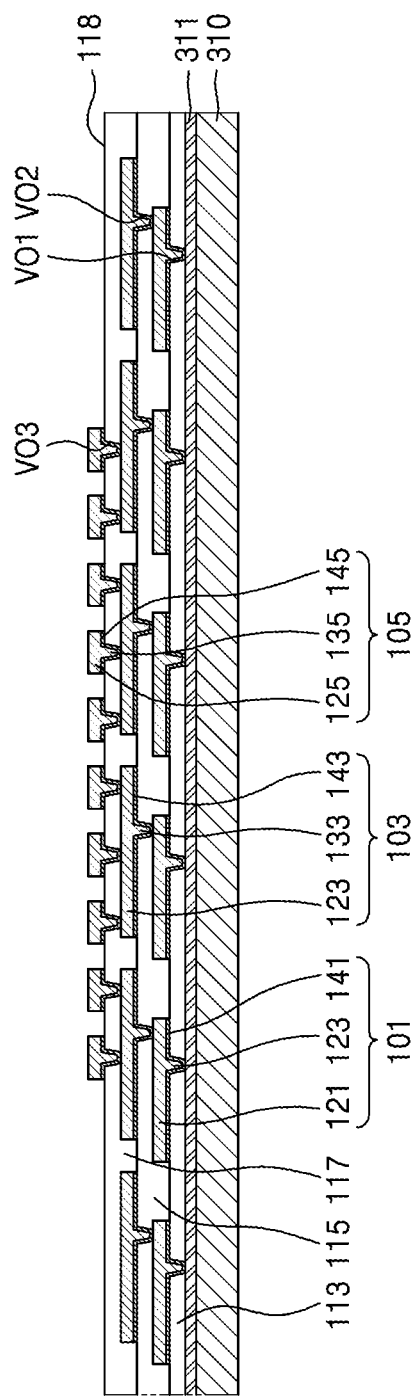
FIGS. 9A through 9G are cross-sectional views sequentially illustrating a method of manufacturing a semiconductor package according to some embodiments of the inventive concept.

Referring to FIG. 9A, the second insulating layer 113, the first redistribution pattern 101, the third insulating layer 115, the second redistribution pattern 103, the fourth insulating layer 117 and the third redistribution pattern 105 are sequentially formed on the carrier substrate 310. The second to fourth insulating layers 113, 115, and 117 and the first to third redistribution patterns 101, 103, and 105 may be formed through a process, which is substantially the same as or similar to that described above with reference to FIGS. 8D to 8F, and, thus, redundant descriptions are omitted.

Figure 9B:
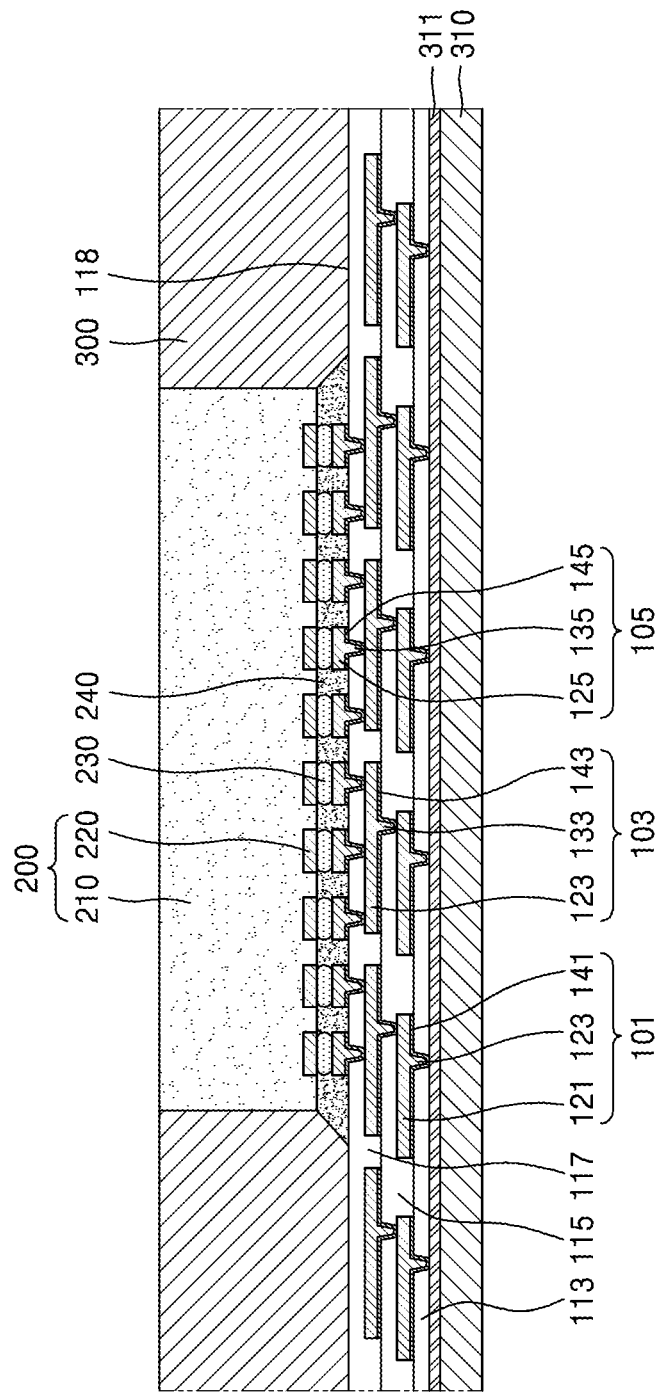

Referring to FIG. 9B, after forming the second to fourth insulating layers 113, 115, and 117 and the first to third redistribution patterns 101, 103, and 105, the semiconductor chip 200 is mounted on the resultant structure of FIG. 9A and the underfill material layer 240 and the molding layer 300 are formed. The semiconductor chip 200, the underfill material layer 240, and the molding layer 300 may be formed through a process, which is substantially the same as or similar to that described with reference to FIGS. 8G and 8H, and thus redundant descriptions will be omitted.

Figure 9C:
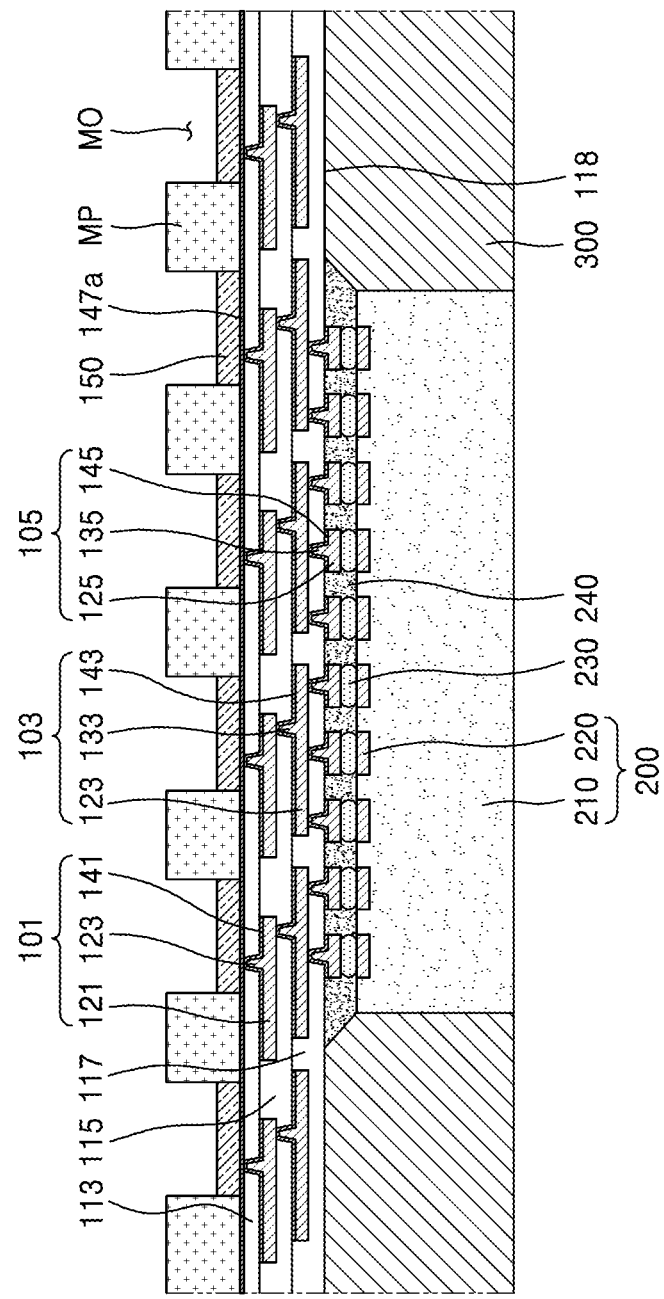

Referring to FIG. 9C, the carrier substrate 310 is removed from a resultant of FIG. 9B. After removing the carrier substrate 310, the lower seed layer 147a is formed on a surface of the second insulating layer 113 exposed by removing the carrier substrate 310 and the mask pattern MP including the mask opening MO is formed on the lower seed layer 147a. After forming the mask pattern MP, the lower bump pad 150 is formed on a part of the lower seed layer 147a exposed through the mask opening MO of the mask pattern MP.

Figure 9D:
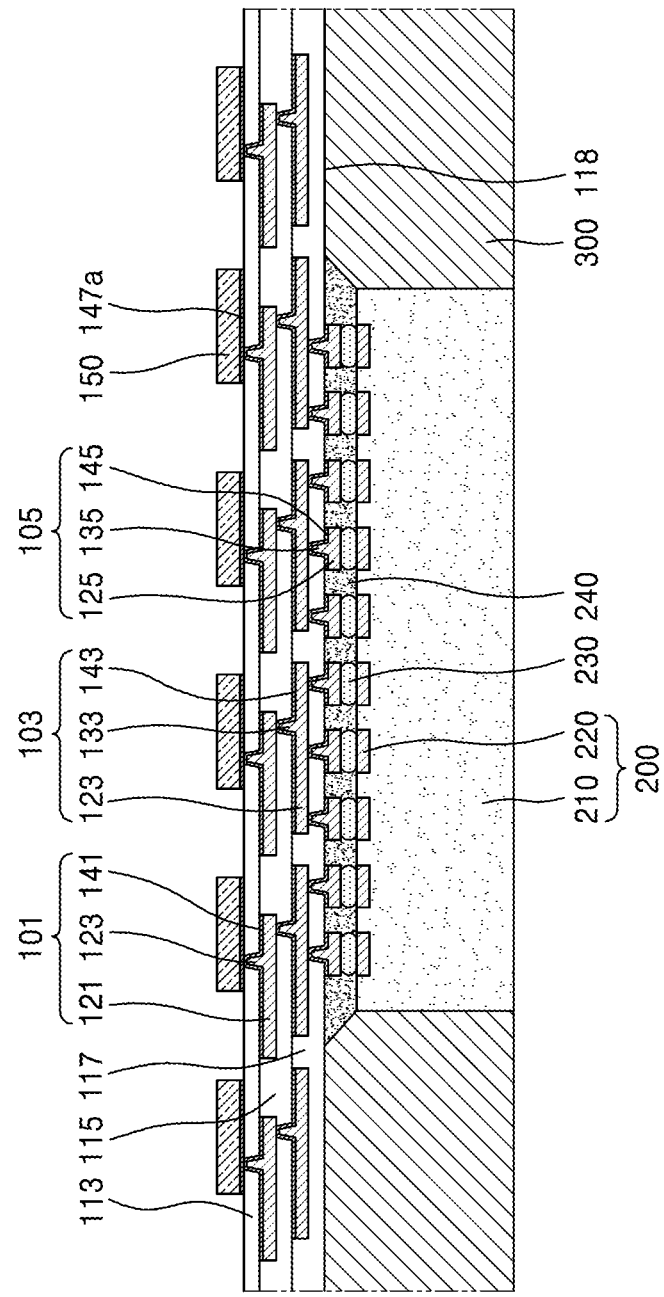

Referring to FIG. 9D together with FIG. 9C, after forming the lower bump pad 150, the mask pattern MP is removed, and a part of the lower seed layer 147a exposed by removing the mask pattern MP may be removed. Another part of the lower seed layer 147a covered by the lower bump pad 150 may remain.

Figure 9E:
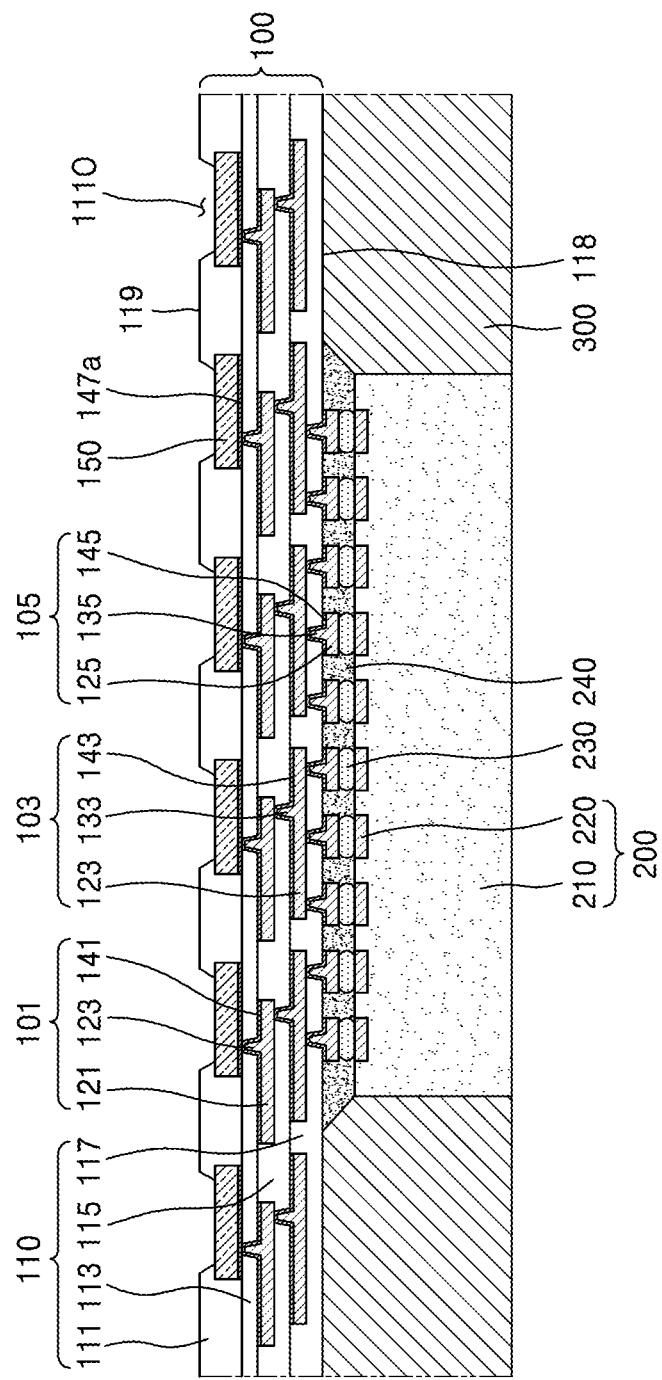

Referring to FIG. 9E, the first insulating layer 111 including the pad opening 111O at least partially exposing the lower seed layer 147a may be formed. For example, to form the first insulating layer 111, an insulating material film at least partially covering the lower bump pad 150 may be formed on the second insulating layer 113, and a part of the insulating material film may be removed to form the pad opening 111O. For example, to form the pad opening 111O, an RIE process using plasma, laser drilling, etc. may be performed. The pad opening 111O may have a shape in which the width in the horizontal direction gradually increases upward as shown in FIG. 9E. The first to fourth insulating layers 111, 113, 115, and 117, the first to third redistribution patterns 101, 103, and 105, the lower bump pad 150, and the lower seed layer 147a may form a redistribution structure 100.

Unlike the semiconductor package 10 described with reference to FIG. 1, because the lower seed layer 147a is formed on a second surface of the lower bump pad 150, an edge portion of a first surface of the lower bump pad 150 may be in direct physical contact with the first insulating layer 111.

Figure 9F:
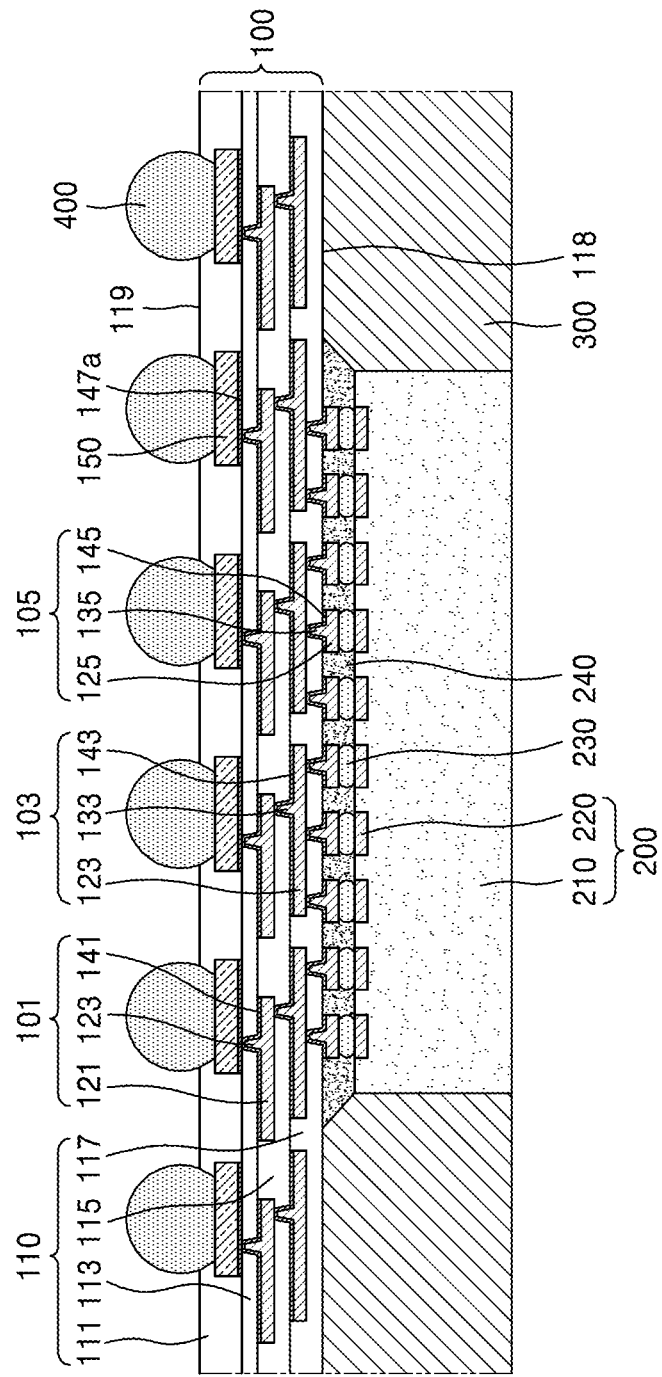

Referring to FIG. 9F, the external connection bump 400 is attached onto the lower bump pad 150. The external connection bump 400 may be formed to at least partially fill the pad opening 111O formed in the first insulating layer 111 and to be in physical contact with the surface of the lower bump pad 150 exposed through the pad opening 111O.

Figure 9G:
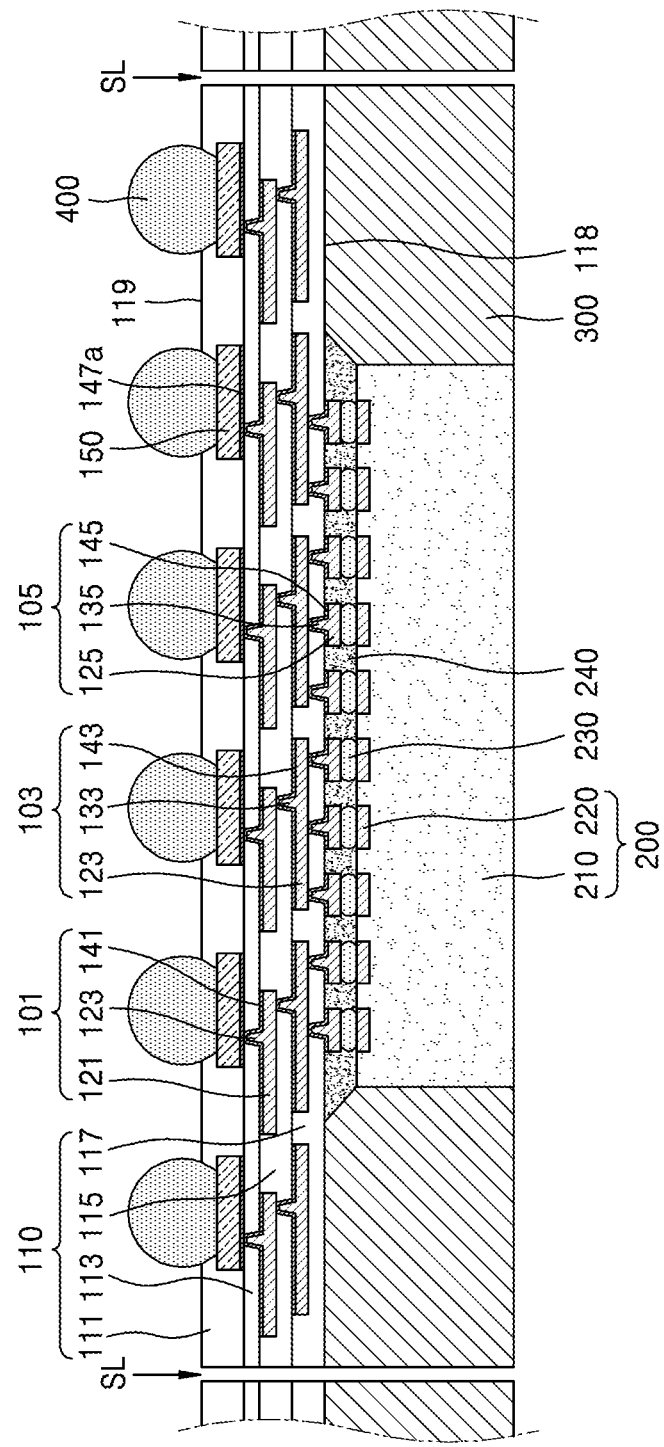

Referring to FIG. 9G, after the external connection bump 400 is formed, an individualized semiconductor package may be completed through a singulation process of cutting a resultant structure of FIG. 9F along the scribe lane SL.

While the inventive concept has been particularly shown and described with reference to embodiments thereof, it will be understood that various changes in form and details may be made therein without departing from the spirit and scope of the following claims.

What is claimed is:

1. A semiconductor package comprising:
a semiconductor chip;
a redistribution insulating layer comprising a first opening;
an external connection bump comprising a first part in the first opening and contacting the redistribution insulating layer;
a lower bump pad comprising a first surface in physical contact with the first part of the external connection bump and a second surface opposite to the first surface, wherein the first surface and the redistribution insulating layer partially overlap;
a lower seed layer in physical contact with the first surface of the lower bump pad; and
a redistribution pattern that electrically connects the lower bump pad to the semiconductor chip;
wherein the first surface of the lower bump pad includes a central portion contacting the first part of the external connection bump and an outer portion contacting the lower seed layer,
wherein the lower seed layer extends laterally from a sidewall of the external connection bump along the outer portion of the first surface of the lower bump pad,
wherein a surface of the lower seed layer is in physical contact with the outer portion of the first surface of the lower bump pad and is coplanar with a surface of the external connection bump in physical contact with the central portion of the first surface of the lower bump pad, and
wherein the central portion of the first surface of the lower bump pad and the outer portion of the first surface of the lower bump pad are flat.

2. The semiconductor package of claim 1, wherein the first surface and the second surface of the lower bump pad are flat; and
wherein the lower bump pad has an overall uniform thickness.

3. The semiconductor package of claim 1, wherein the lower seed layer borders the sidewall of the external connection bump.

4. The semiconductor package of claim 1, wherein the redistribution insulating layer further comprises a second opening, and
wherein the redistribution pattern further comprises a conductive via pattern in the second opening and in physical contact with the second surface of the lower bump pad.

5. The semiconductor package of claim 4, wherein the first opening has a width that increases as a distance from the first surface of the lower bump pad increases, and
wherein the second opening has a width that increases as a distance from the second surface of the lower bump pad increases.

6. The semiconductor package of claim 4, wherein the lower bump pad comprises:
a first conductive layer in physical contact with the external connection bump;
a second conductive layer in physical contact with the conductive via pattern; and
a conductive barrier layer interposed between the first conductive layer and the second conductive layer.

7. The semiconductor package of claim 6, wherein each of the first conductive layer and the second conductive layer comprises copper (Cu), and
wherein the conductive barrier layer comprises nickel (Ni).

8. The semiconductor package of claim 6, wherein a thickness of the first conductive layer is greater than a thickness of the second conductive layer.

9. The semiconductor package of claim 6, wherein the redistribution insulating layer comprises an upper surface facing the semiconductor chip and a lower surface opposite to the upper surface, and
wherein a distance between the first surface of the lower bump pad and the lower surface of the redistribution insulating layer is between about 3 μm and about 20 μm.

10. The semiconductor package of claim 1, wherein the first surface of the lower bump pad is in direct physical contact with the redistribution insulating layer.

11. A semiconductor package comprising:
a semiconductor chip;
a redistribution insulating layer comprising an opening;
an external connection bump comprising a first part in the opening;
a lower bump pad comprising a first surface in physical contact with the first part of the external connection bump and a second surface opposite to the first surface;
a lower seed layer on the first surface of the lower bump pad and in physical contact with a sidewall of the external connection bump; and
a redistribution pattern that electrically connects the lower bump pad to the semiconductor chip,
wherein a surface of the lower seed layer is in physical contact with an outer portion of the first surface of the lower bump pad and is coplanar with a surface of the external connection bump in physical contact with a central portion of the first surface of the lower bump pad, and
wherein the central portion of the first surface of the lower bump pad and the outer portion of the first surface of the lower bump pad are flat.

12. The semiconductor package of claim 11, wherein the first surface and the second surface of the lower bump pad are flat.

13. The semiconductor package of claim 11, wherein the redistribution pattern comprises a conductive via pattern in physical contact with the second surface of the lower bump pad, the conductive via pattern having a width that increases as a distance from the second surface of the lower bump pad increases,
wherein the first part of the external connection bump has a width that increases as a distance from the first surface of the lower bump pad increases.

14. The semiconductor package of claim 13, wherein the lower bump pad comprises:
a first conductive layer in physical contact with the external connection bump;
a second conductive layer in physical contact with the conductive via pattern; and
a conductive barrier layer interposed between the first conductive layer and the second conductive layer and separating the first conductive layer from the second conductive layer.

15. A semiconductor package comprising:
a semiconductor chip;

a redistribution insulating layer comprising an opening;

an external connection bump comprising a first part in the opening;

a lower bump pad comprising a first conductive layer in physical contact with the first part of the external connection bump, a conductive barrier layer on the first conductive layer, and a second conductive layer spaced apart from the first conductive layer with the conductive barrier layer interposed therebetween; and a redistribution pattern that electrically connects the lower bump pad to the semiconductor chip;

wherein, in a cross-sectional view of the semiconductor package, a horizontal width of the first conductive layer, a horizontal width of the conductive barrier layer, and a horizontal width of the second conductive layer are equal;

wherein a surface of a lower seed layer is in physical contact with an outer portion of the first surface of the lower bump pad and is coplanar with a surface of the external connection bump in physical contact with a central portion of the first surface of the lower bump pad, and wherein the central portion of the first surface of the lower bump pad and the outer portion of the first surface of the lower bump pad are flat.

16. The semiconductor package of claim 15, wherein a surface of the first conductive layer in physical contact with the first part of the external connection bump is flat.

17. The semiconductor package of claim 16, wherein a thickness of the first conductive layer is greater than a thickness of the second conductive layer.

18. The semiconductor package of claim 16, wherein the lower seed layer is on the surface of the first conductive layer and borders a sidewall of the external connection bump, wherein the redistribution insulating layer is on the lower seed layer.

* * * * *